US012642098B2

(12) United States Patent (10) Patent No.: US 12,642,098 B2
Chang (45) Date of Patent: May 26, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventor: Gunho Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 487 days.

(21) Appl. No.: 18/132,171

(22) Filed: Apr. 7, 2023

(65) Prior Publication Data

US 2024/0071951 A1 Feb. 29, 2024

(30) Foreign Application Priority Data

Aug. 26, 2022 (KR) ........................ 10-2022-0107717

(51) Int. Cl.
H10B 80/00 (2026.01)
H10W 20/20 (2026.01)
(Continued)

(52) U.S. Cl.
CPC .......... H10W 42/121 (2026.01); H10B 80/00 (2023.02); H10W 20/20 (2026.01);
(Continued)

(58) Field of Classification Search
CPC . H01L 23/562; H01L 23/3128; H01L 23/481; H01L 23/49827; H01L 24/08; H01L 24/16; H01L 24/32; H01L 24/73; H01L 2224/08146; H01L 2224/08225; H01L 2224/16145; H01L 2224/32059; H01L 2224/32145; H01L 2224/73204; H10B 80/00; H10W 42/121; H10W 20/20; H10W 70/635; H10W 74/117;
(Continued)

(56) References Cited

U.S. PATENT DOCUMENTS 9,607,973 B1 3/2017 Fasano et al.
9,679,874 B2 6/2017 Bae et al.
(Continued)

FOREIGN PATENT DOCUMENTS

KR 10-2017-0143124 A 12/2017
KR 10-2021-0098728 A 8/2021
KR 10-2360381 B 2/2022

*Primary Examiner* — Benjamin Tzu-Hung Liu
(74) *Attorney, Agent, or Firm* — Sughrue Mion, PLLC

(57) ABSTRACT

A semiconductor package including a substrate comprising a plurality of vias; a chip stack on the substrate; and a mold layer on the substrate and on at least a portion of the chip stack. The chip stack includes a first semiconductor chip; second semiconductor chips stacked on the first semiconductor chip; a third semiconductor chip on the uppermost one of the second semiconductor chips; and non-conductive layers between the first semiconductor chip and the second semiconductor chips. A first chip pad of the first semiconductor chip is bonded to a substrate pad of the substrate. A second chip pad of the uppermost one of the second semiconductor chips is bonded to a third chip pad of the third semiconductor chip. Each of the second semiconductor chips is electrically connected to another of the second semiconductor chips or the first semiconductor chip.

20 Claims, 19 Drawing Sheets

(51) Int. Cl.

| | |
|---|---|
| *H10W 42/00* | (2026.01) |
| *H10W 70/63* | (2026.01) |
| *H10W 72/00* | (2026.01) |
| *H10W 72/30* | (2026.01) |
| *H10W 74/10* | (2026.01) |
| *H10W 74/15* | (2026.01) |
| *H10W 90/00* | (2026.01) |

(52) U.S. Cl.
CPC ........ *H10W 70/635* (2026.01); *H10W 74/117* (2026.01); *H10W 72/07353* (2026.01); *H10W 72/334* (2026.01); *H10W 74/15* (2026.01); *H10W 90/722* (2026.01); *H10W 90/732* (2026.01); *H10W 90/792* (2026.01); *H10W 90/794* (2026.01)

(58) Field of Classification Search
CPC ......... H10W 72/07353; H10W 72/334; H10W 74/15; H10W 90/722; H10W 90/732; H10W 90/792; H10W 90/794
See application file for complete search history.

(56) References Cited

U.S. PATENT DOCUMENTS

| | | | | |
|---|---|---|---|---|
| 11,043,472 | B1 | 6/2021 | Dokania et al. | |
| 11,211,378 | B2 | 12/2021 | Farooq et al. | |
| 11,289,454 | B2 | 3/2022 | Kim | |
| 2018/0174939 | A1* | 6/2018 | Miki ................... | H01L 25/0657 |
| 2020/0219833 | A1 | 7/2020 | Lee et al. | |
| 2020/0328189 | A1 | 10/2020 | Sung | |
| 2020/0357766 | A1 | 11/2020 | Su | |
| 2021/0143126 | A1 | 5/2021 | Choi et al. | |
| 2021/0375827 | A1* | 12/2021 | Chen ................... | H01L 25/0657 |
| 2023/0207525 | A1* | 6/2023 | Mallik ............... | H01L 25/0657 257/668 |

* cited by examiner

SEMICONDUCTOR PACKAGE AND METHOD OF FABRICATING THE SAME

CROSS-REFERENCE TO RELATED APPLICATIONS

This application claims priority to Korean Patent Application No. 10-2022-0107717, filed on Aug. 26, 2022, in the Korean Intellectual Property Office, the disclosure of which is incorporated by reference herein in its entirety.

BACKGROUND

The present disclosure relates to a semiconductor package and a method of fabricating the same, and in particular, to a stack-type semiconductor package, which may include a substrate and a plurality of semiconductor chips stacked thereon, and a method of fabricating the same.

With recent advances in the electronics industry, demand for high-performance, high-speed, and compact electronic components are increasing. To meet this demand, packaging technologies for mounting a plurality of semiconductor chips in a single package are being developed.

Recently, demand for portable electronic devices has been rapidly increasing in the market, and thus, it may be necessary to reduce sizes and weights of electronic components constituting the portable electronic devices. For this, it is necessary to develop packaging technologies of reducing a size and a weight of each component and of integrating a plurality of individual components in a single package. A plurality of adhesive members may be used to attach the components to each other, but increasing the number of adhesive members may lead to various technical problems.

SUMMARY

One or more example embodiments provide a semiconductor package with improved structural stability and a method of fabricating the same, and a method of reducing a failure in a process of fabricating a semiconductor package and a semiconductor package fabricated thereby.

According to an aspect of an example embodiment, a semiconductor package includes: a substrate comprising a plurality of vias; a chip stack on the substrate; and a mold layer on the substrate and on at least a portion of the chip stack, wherein the chip stack comprises: a first semiconductor chip; second semiconductor chips stacked on the first semiconductor chip; a third semiconductor chip on the uppermost one of the second semiconductor chips; and non-conductive layers between the first semiconductor chip and the second semiconductor chips, wherein a first chip pad of the first semiconductor chip is bonded to a substrate pad of the substrate, wherein the first chip pad and the substrate pad each comprise the same metallic material and form a first single structure or layer, wherein a second chip pad of the uppermost one of the second semiconductor chips is bonded to a third chip pad of the third semiconductor chip, wherein the second chip pad and the third chip pad each comprise the same metallic material and form a second single structure or layer, each of the second semiconductor chips is electrically connected to another of the second semiconductor chips or the first semiconductor chip using connection terminals on a bottom surface of each of the second semiconductor chips.

According to an aspect of an example embodiment, a semiconductor package, includes: a semiconductor substrate; a chip stack on the semiconductor substrate; and a mold layer on the semiconductor substrate and the chip stack, wherein the chip stack comprises: a first semiconductor chip on the semiconductor substrate; chip structures stacked on the first semiconductor chip; and non-conductive layers between the first semiconductor chip and the chip structures, wherein each of the chip structures comprises: a second semiconductor chip; a third semiconductor chip on the second semiconductor chip; and first connection terminals on a bottom surface of the second semiconductor chip, a bottom surface of the first semiconductor chip is in direct contact with a top surface of the semiconductor substrate, wherein, in the chip structures, a bottom surface of the third semiconductor chip is in direct contact with a top surface of the second semiconductor chip, wherein the non-conductive layers are disposed on the first connection terminals, between the first semiconductor chip and the chip structures, and wherein the non-conductive layers are spaced apart from the semiconductor substrate.

According to an aspect of an example embodiment, a semiconductor package, includes: a semiconductor substrate comprising a substrate pad; a first semiconductor chip on the semiconductor substrate, the first semiconductor chip comprising a first chip pad bonded to the substrate pad of the semiconductor substrate, the first chip pad and the substrate pad each comprise the same metallic material and form a single structure or layer; a second semiconductor chip on the first semiconductor chip and electrically connected to the first semiconductor chip using connection terminals disposed on a bottom surface of the second semiconductor chip; a non-conductive layer on the bottom surface of the second semiconductor chip and the connection terminals; a third semiconductor chip on the second semiconductor chip, the second and third semiconductor chips comprising second and third chip pads, respectively, wherein the second and third chip pads each comprise the same metallic material and are bonded to each other and form a single structure or layer; and a mold layer on the semiconductor substrate and the first to third semiconductor chips, wherein the non-conductive layer is spaced apart from the semiconductor substrate and the third semiconductor chip.

According to an aspect of an example embodiment, a method of fabricating a semiconductor package, including: providing a semiconductor substrate comprising a substrate pad; providing a first semiconductor chip comprising a first chip pad; bringing the first semiconductor chip in to contact with the semiconductor substrate such that the first chip pad is vertically aligned to the substrate pad; performing a first thermal treatment process on the semiconductor substrate and the first semiconductor chip to bond the first semiconductor chip to the semiconductor substrate; providing a second semiconductor chip comprising a second chip pad; providing a third semiconductor chip comprising a third chip pad; bringing the third semiconductor chip into contact with the second semiconductor chip such that the second chip pad is vertically aligned to the third chip pad; performing a second thermal treatment process on the second and third semiconductor chips to bond the third semiconductor chip to the second semiconductor chip; and mounting the second semiconductor chip on the first semiconductor chip using first connection terminals, wherein the substrate pad and the first chip pad each comprise the same metallic material and form a single structure or layer by the first thermal treatment process, and the second chip pad and the third chip pad form a single structure or layer, which is formed of the same metallic material as the substrate pad, by the second thermal treatment process.

BRIEF DESCRIPTION OF DRAWINGS

The above and other aspects and features will be more apparent from the following description of example embodiments, taken in conjunction with the accompanying drawings, in which:

FIG. 1 is a cross-sectional view illustrating a semiconductor package according to an embodiment.

FIGS. 3, 4, 5, 6, 7, and 8 are cross-sectional views, each of which illustrates a semiconductor package according to an embodiment.

DETAILED DESCRIPTION

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
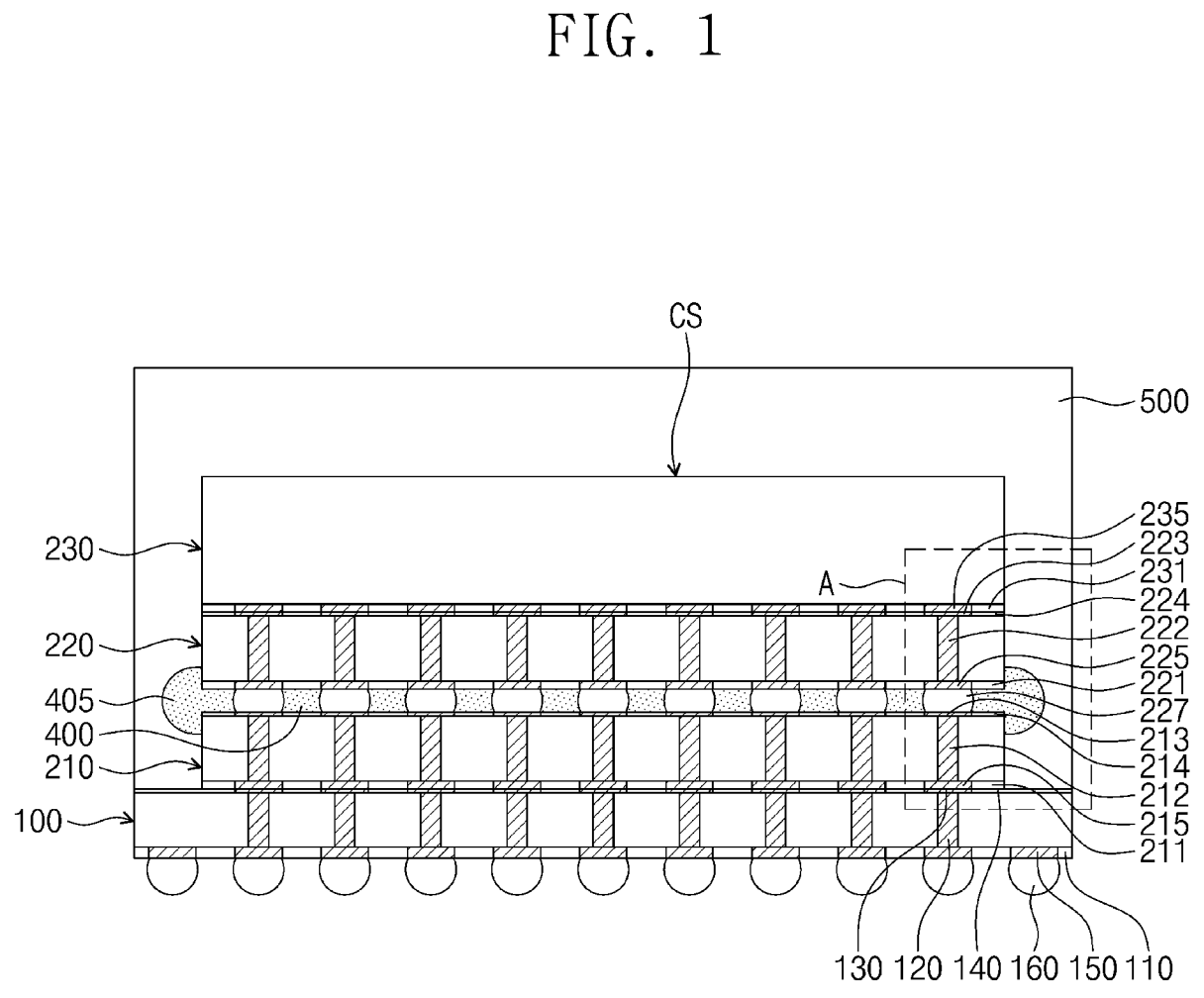
Figure 2:
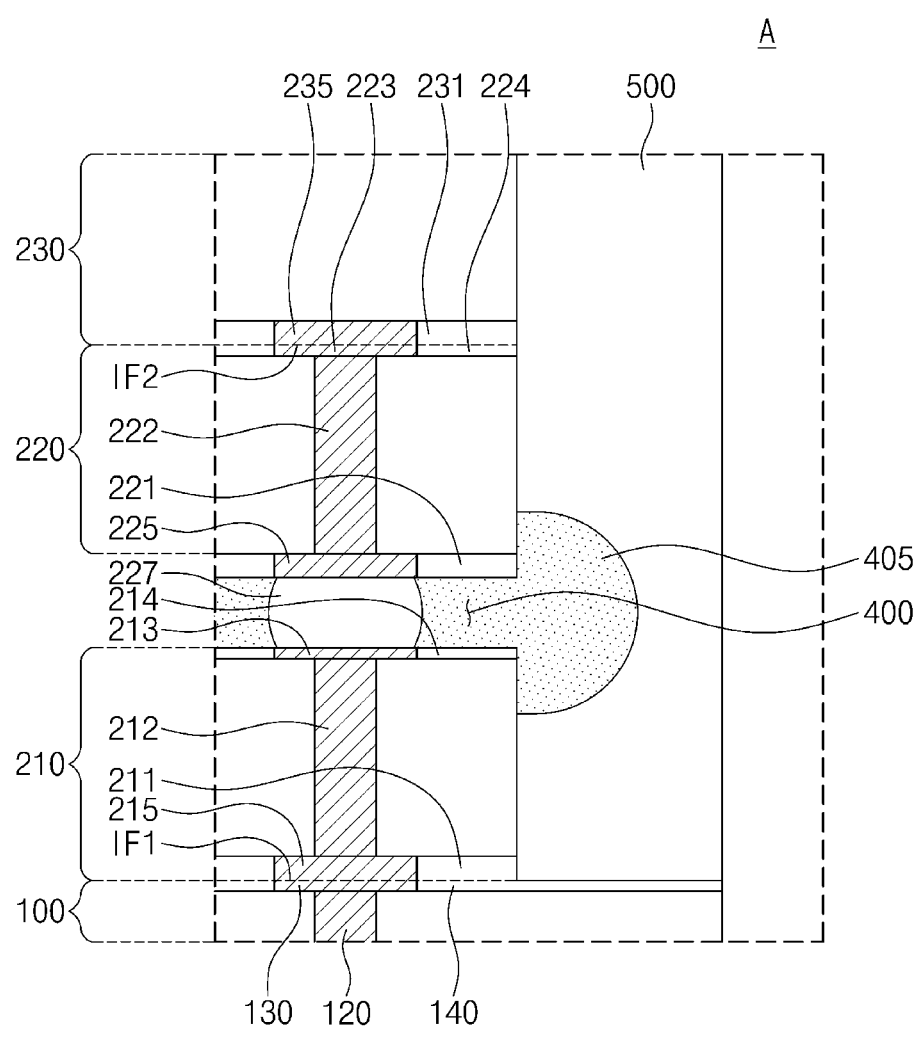
FIG. 2 is an enlarged sectional view illustrating a section A of FIG. 1.

FIG. 1 is a cross-sectional view illustrating a semiconductor package according to an embodiment. FIG. 2 is an enlarged sectional view illustrating a section A of FIG. 1.

A semiconductor package according to an embodiment may be a stack-type package that is realized using via patterns. For example, semiconductor chips of the same kind may be stacked on a base substrate and may be electrically connected to each other through via patterns penetrating the base substrate. The semiconductor chips may be coupled to each other using chip terminals, which are provided on bottom surfaces thereof.

Referring to FIGS. 1 and 2, a base substrate 100 may be provided. The base substrate 100 may include an integrated circuit which is provided therein. In detail, the base substrate 100 may be a base semiconductor chip including an electronic device (e.g., a transistor). For example, the base substrate 100 may be a wafer-level die formed of a semiconductor material (e.g., silicon (Si)). FIG. 1 illustrates an example, in which the base substrate 100 is a base semiconductor chip, but the embodiments are not limited to this example. In an embodiment, the base substrate 100 may be a substrate (e.g., a printed circuit board (PCB)), in which an electronic element (e.g., a transistor) is not provided. A silicon wafer may be thinner than the printed circuit board (PCB). Hereinafter, the base substrate 100 may be referred to as a base semiconductor chip 100.

The base semiconductor chip 100 may include a first circuit layer 110, a first via 120, a first rear pad 130, a first protection layer 140, and a first front pad 150.

The first circuit layer 110 may be provided on a bottom surface of the base semiconductor chip 100. The first circuit layer 110 may include the afore-described integrated circuit. For example, the first circuit layer 110 may be a memory circuit, a logic circuit, or combinations thereof. That is, the bottom surface of the base semiconductor chip 100 may be an active surface. The first circuit layer 110 may include, for example, one or more of an electronic element (e.g., a transistor), an insulating pattern, and an interconnection pattern.

The first via 120 may be provided to vertically penetrate and extend through the base semiconductor chip 100. For example, the first via 120 may connect an element, which is provided on a top surface of the base semiconductor chip 100, to the first circuit layer 110. The first via 120 and the first circuit layer 110 may be electrically connected to each other. In an embodiment, a plurality of first vias 120 may be provided. In some embodiments, an insulating layer (not shown) may be provided to enclose the first via 120. For example, the insulating layer (not shown) may be formed of or include at least one of silicon oxide (SiO), silicon nitride (SiN), silicon oxynitride (SiON), and low-k dielectric materials.

The first rear pad 130 may be disposed on the top surface of the base semiconductor chip 100. The first rear pad 130 may be coupled to the first via 120. In an embodiment, a plurality of first rear pads 130 may be provided. In this case, the first rear pads 130 may be coupled to a plurality of first vias 120, respectively, and the first rear pads 130 may be arranged in a shape corresponding to the arrangement of the first vias 120. The first rear pad 130 may be coupled to the first circuit layer 110 through the first via 120. The first rear pad 130 may be formed of or include at least one of various metallic materials (e.g., copper (Cu), aluminum (Al), and/or nickel (Ni)).

The first protection layer 140 may be disposed on the top surface of the base semiconductor chip 100 and around a portion of the first rear pad 130. For example, the first protection layer 140 may be disposed around a bottom portion of the first rear pad 130, the bottom being adjacent to the top surface of the base semiconductor chip 100. In an embodiment, the first protection layer 140 may enclose at least a portion of the first rear pad 130. For example, in an embodiment, the first protection layer may enclose the bottom portion of the first rear pad 130 adjacent to the top surface of the base semiconductor chip. The first protection layer 140 may be disposed such that at least a portion of the first rear pad 130 is exposed. For example, in an embodiment, the first protection layer 140 may be disposed around a bottom portion of the first rear pad 130 and a top portion of the first rear pad 130 may be exposed. In some embodiments, a top surface of the first protection layer 140 may be coplanar with a top surface of the first rear pad 130. The base semiconductor chip 100 may be protected by the first protection layer 140. The first protection layer 140 may be formed of or include at least one of silicon oxide (SiO), silicon nitride (SiN), silicon oxynitride (SiON), or silicon carbon nitride (SiCN).

The first front pad 150 may be disposed on the bottom surface of the base semiconductor chip 100. In more detail, the first front pad 150 may be exposed to the outside of the first circuit layer 110 near a bottom surface of the first circuit layer 110. A bottom surface of the first front pad 150 may be coplanar with the bottom surface of the first circuit layer 110. The first front pad 150 may be electrically connected to the first circuit layer 110. In an embodiment, a plurality of first front pads 150 may be provided. The first front pad 150 may be formed of or include at least one of various metallic materials (e.g., copper (Cu), aluminum (Al), and/or nickel (Ni)).

Although not shown, in some embodiments, the base semiconductor chip 100 may further include a lower protection layer (not shown). The lower protection layer (not shown) may be disposed on the bottom surface of the base semiconductor chip 100 and the first circuit layer 110. In an embodiment may the lower protection layer may cover the first circuit layer 110. The first circuit layer 110 may be protected by the lower protection layer (not shown). The lower protection layer (not shown) may leave at least a portion of the first front pad 150 exposed. The lower protection layer (not shown) may be formed of or include at least one of silicon oxide (SiO), silicon nitride (SiN), silicon oxynitride (SiON), or silicon carbon nitride (SiCN).

An outer terminal 160 may be provided on the bottom surface of the base semiconductor chip 100. The outer terminal 160 may be disposed on the first front pad 150. The outer terminal 160 may be electrically connected to the first circuit layer 110 and the first via 120. In an embodiment, the outer terminal 160 may be disposed below the first via 120. In this case, the first via 120 may penetrate the first circuit layer 110 and may be exposed to the outside of the first circuit layer 110 near the bottom surface of the first circuit layer 110, and the outer terminal 160 may be directly coupled to the first via 120. In an embodiment, a plurality of outer terminals 160 may be provided. In this case, the outer terminals 160 may be coupled to a plurality of first front pads 150, respectively. The outer terminal 160 may be formed of or include an alloy containing at least one of tin (Sn), silver (Ag), copper (Cu), nickel (Ni), bismuth (Bi), indium (In), antimony (Sb), or cerium (Ce).

A chip stack CS may be disposed on the base semiconductor chip 100. The chip stack CS may include a plurality of semiconductor chips 210, 220, and 230. The semiconductor chips 210, 220, and 230 may be of the same kind. For example, the semiconductor chips 210, 220, and 230 may be memory chips. The chip stack CS may include a lower semiconductor chip 210 directly connected to the base semiconductor chip 100, an intermediate semiconductor chip 220 disposed on the lower semiconductor chip 210, and an upper semiconductor chip 230 disposed on the intermediate semiconductor chip 220. The lower, intermediate, and upper semiconductor chips 210, 220, and 230 may be sequentially stacked on the base semiconductor chip 100.

The lower semiconductor chip 210 may include a second circuit layer 211, which is disposed to face the base semiconductor chip 100. The second circuit layer 211 may be provided on a bottom surface of the lower semiconductor chip 210. The second circuit layer 211 may include the afore-described integrated circuit. For example, the second circuit layer 211 may include a memory circuit. In other words, the bottom surface of the lower semiconductor chip 210 may be an active surface. The second circuit layer 211 may include one or more of an electronic element (e.g., a transistor), an insulating pattern, and an interconnection pattern.

The lower semiconductor chip 210 may include a second protection layer 214, which is provided opposite to the second circuit layer 211. The second protection layer 214 may be provided on a top surface of the lower semiconductor chip 210. The second protection layer 214 may protect the lower semiconductor chip 210. The second protection layer 214 may be formed of or include at least one of silicon oxide (SiO), silicon nitride (SiN), silicon oxynitride (SiON), or silicon carbon nitride (SiCN).

The lower semiconductor chip 210 may include a second via 212, which is provided to penetrate and extend through a portion of the lower semiconductor chip 210 in a direction from the second protection layer 214 toward the second circuit layer 211. In an embodiment, a plurality of second vias 212 may be provided. An insulating layer (not shown) may be provided a portion or all of the second via 212. The insulating layer may enclose a portion or all of the second via 212. For example, the insulating layer (not shown) may be formed of or include at least one of silicon oxide (SiO), silicon nitride (SiN), silicon oxynitride (SiON), or low-k dielectric materials. The second via 212 may be electrically connected to the second circuit layer 211.

A second rear pad 213 may be disposed in the second protection layer 214. The second rear pad 213 may have a top surface, which is not veiled by the second protection layer 214 so that the top surface is exposed and may connect with other elements. In an embodiment, the second rear pad 213 may have a top surface and the second protection layer 214 may be not disposed on at least a part of the top surface of the second rear pad 213. A top surface of the second protection layer 214 may be coplanar with a top surface of the second rear pad 213. The second rear pad 213 may be connected to the second via 212. A second front pad 215 may be disposed on the second circuit layer 211. In more detail, the second front pad 215 may be exposed to the outside of the second circuit layer 211 near a bottom surface of the second circuit layer 211. A bottom surface of the second front pad 215 may be coplanar with the bottom surface of the second circuit layer 211. The second front pad 215 may be coupled to the second circuit layer 211. The second rear pad 213 and the second front pad 215 may be electrically connected to each other through the second circuit layer 211 and the second via 212. In an embodiment, a plurality of second rear pads 213 and a plurality of second front pads 215 may be provided. The second rear pad 213 and the second front pad 215 may be formed of or include at least one of various metallic materials (e.g., copper (Cu), aluminum (Al), and/or nickel (Ni)).

The lower semiconductor chip 210 may be mounted on the base semiconductor chip 100. In more detail, the lower semiconductor chip 210 may be disposed on the base semiconductor chip 100. The lower semiconductor chip 210 may be disposed on the base semiconductor chip 100 face down. The first rear pad 130 of the base semiconductor chip 100 may be vertically aligned to the second front pad 215 of the lower semiconductor chip 210. The base semiconductor chip 100 and the lower semiconductor chip 210 may be in contact with each other such that the first rear pad 130 is connected to the second front pad 215.

The lower semiconductor chip 210 may be connected to the base semiconductor chip 100. The lower and base semiconductor chips 210 and 100 may be in contact with each other. At an interface between the lower and base semiconductor chips 210 and 100, the first rear pad 130 of the base semiconductor chip 100 may be bonded to the second front pad 215 of the lower semiconductor chip 210. Here, the first rear pad 130 and the second front pad 215 may form a metal-to-metal hybrid bonding structure. In the present specification, the hybrid bonding structure may mean a bonding structure, in which two materials of the same kind are fused at an interface therebetween. For example, the first rear pad 130 and the second front pad 215, which are bonded to each other, may have a continuous structure, and a first interface IF1 between the first rear pad 130 and the second front pad 215 may not be visible. For example, the first rear pad 130 and the second front pad 215 may be formed of the same material, and in this case, there may be no interface between the first rear pad 130 and the second front pad 215. In other words, the first rear pad 130 and the second front pad 215 may be provided as a single element. For example, the first rear pad 130 and the second front pad 215 may be bonded or coupled to each other to form a single structure or layer without an interface therebetween.

At an interface between the base semiconductor chip 100 and the lower semiconductor chip 210, the first protection layer 140 of the base semiconductor chip 100 may be bonded to an insulating pattern of the second circuit layer 211 of the lower semiconductor chip 210. Here, the first protection layer 140 and the insulating pattern of the second circuit layer 211 may form a hybrid bonding structure of oxide, nitride, or oxynitride. For example, the first protection layer 140 and the insulating pattern of the second circuit layer 211 may be formed of the same material, and in this case, there may be no interface between the first protection layer 140 and the insulating pattern of the second circuit layer 211. In other words, the first protection layer 140 and the insulating pattern of the second circuit layer 211 may be bonded or coupled to each other to form a single structure or layer without an interface therebetween. However, embodiments are not limited to this example. The first protection layer 140 and the insulating pattern of the second circuit layer 211 may be formed of different materials and may not have a continuous structure, and in this case, there may be a visible interface between the first protection layer 140 and the insulating pattern of the second circuit layer 211.

The intermediate semiconductor chip 220 may have substantially the same structure as the lower semiconductor chip 210. For example, the intermediate semiconductor chip 220 may include a third circuit layer 221, which is provided to face the base semiconductor chip 100, a third protection layer 224, which is opposite to the third circuit layer 221, a third via 222, which is provided to penetrate the intermediate semiconductor chip 220 in a direction from the third protection layer 224 toward the third circuit layer 221, a third rear pad 223, which is provided in the third protection layer 224, and a third front pad 225, which is provided on the third circuit layer 221. The third circuit layer 221 and the third front pad 225 may be provided on a bottom surface of the intermediate semiconductor chip 220, and the bottom surface of the intermediate semiconductor chip 220 may be an active surface. The third protection layer 224 and the third rear pad 223 may be provided on a top surface of the intermediate semiconductor chip 220.

The upper semiconductor chip 230 may have a structure that is substantially similar to the lower semiconductor chip 210. For example, the upper semiconductor chip 230 may include a fourth circuit layer 231, which is provided to face the base semiconductor chip 100, and a fourth front pad 235, which is provided on the fourth circuit layer 231. In an embodiment, the upper semiconductor chip 230 may not have a via pattern, a rear pad, and an upper protection layer. However, embodiments are not limited to this example. In an embodiment, the upper semiconductor chip 230 may include at least one of the via pattern, the rear pad, and the upper protection layer. The fourth circuit layer 231 and the fourth front pad 235 may be provided on a bottom surface of the upper semiconductor chip 230, and the bottom surface of the upper semiconductor chip 230 may be an active surface. The upper semiconductor chip 230 may have a thickness that is larger than the lower and intermediate semiconductor chips 210 and 220.

The upper semiconductor chip 230 may be disposed on the intermediate semiconductor chip 220. In an embodiment, the upper semiconductor chip 230 may be mounted on the intermediate semiconductor chip 220. In more detail, the upper semiconductor chip 230 may be disposed on the intermediate semiconductor chip 220 in a face down manner. The third rear pad 223 of the intermediate semiconductor chip 220 may be vertically aligned with the fourth front pad 235 of the upper semiconductor chip 230. The upper and intermediate semiconductor chips 230 and 220 may be in contact with each other such that the third rear pad 223 is connected to the fourth front pad 235.

The upper semiconductor chip 230 may be connected to the intermediate semiconductor chip 220. In an embodiment, the upper and intermediate semiconductor chips 230 and 220 may be in contact with each other. At an interface between the upper and intermediate semiconductor chips 230 and 220, the third rear pad 223 of the intermediate semiconductor chip 220 may be bonded to the fourth front pad 235 of the upper semiconductor chip 230. Here, the third rear pad 223 and the fourth front pad 235 may form a metal-to-metal hybrid bonding structure. For example, the third rear pad 223 and the fourth front pad 235, which are bonded to each other, may form a continuous structure, and a second interface IF2 between the third rear pad 223 and the fourth front pad 235 may not be visible. For example, the third rear pad 223 and the fourth front pad 235 may be formed of the same material, and in this case, there may be no interface between the third rear pad 223 and the fourth front pad 235. In other words, the third rear pad 223 and the fourth front pad 235 may be provided as a single element. For example, the third rear pad 223 and the fourth front pad 235 may be bonded or coupled to each other to form a single structure or layer without an interface therebetween.

At the interface of the upper and intermediate semiconductor chips 230 and 220, the third protection layer 224 of the intermediate semiconductor chip 220 may be disposed on an insulating pattern of the fourth circuit layer 231 of the upper semiconductor chip 230. In an embodiment, the third protection layer 224 of the intermediate semiconductor chip 220 may be bonded to an insulating pattern of the fourth circuit layer 231 of the upper semiconductor chip 230. The third protection layer 224 and the insulating pattern of the fourth circuit layer 231 may form a hybrid bonding structure of, for example, one or more of oxide, nitride, oxynitride, or carbon nitride. For example, the third protection layer 224 and the insulating pattern of the fourth circuit layer 231 may be formed of the same material (e.g., silicon oxide (SiO), silicon nitride (SiN), silicon oxynitride (SiON), or silicon carbon nitride (SiCN)), and in this case, there may be no interface between the third protection layer 224 and the insulating pattern of the fourth circuit layer 231. In other words, the third protection layer 224 and the insulating pattern of the fourth circuit layer 231 may be bonded or coupled to each other to form a single structure or layer without an interface therebetween. However, embodiments not limited to this example. The third protection layer 224 and the insulating pattern of the fourth circuit layer 231 may be formed of different materials and may have a continuous structure, and there may be a visible interface between the third protection layer 224 and the insulating pattern of the fourth circuit layer 231.

The upper and intermediate semiconductor chips 230 and 220 may be bonded or coupled to each other to form a single chip structure.

The intermediate semiconductor chip 220 may be mounted on the lower semiconductor chip 210. For example, the intermediate semiconductor chip 220 may be disposed on the lower semiconductor chip 210 in a face down manner. The intermediate semiconductor chip 220 may be connected to the lower semiconductor chip 210 by a chip connection terminal 227. The chip connection terminal 227 may be disposed between the second rear pad 213 of the lower semiconductor chip 210 and the third front pad 225 of the intermediate semiconductor chip 220. The lower and intermediate semiconductor chips 210 and 220 may be spaced apart from each other, and the chip connection terminal 227 may have the same thickness as a distance between the second rear pad 213 and the third front pad 225. In an embodiment, a plurality of chip connection terminals 227 may be provided. The chip connection terminal 227 may connect the lower semiconductor chip 210 electrically to the intermediate semiconductor chip 220. The chip connection terminal 227 may be solder balls or solder bumps, which are formed of or include an alloy containing at least one of tin (Sn), silver (Ag), copper (Cu), nickel (Ni), bismuth (Bi), indium (In), antimony (Sb), or cerium (Ce).

A non-conductive layer 400 may be provided between the lower and intermediate semiconductor chips 210 and 220. The non-conductive layer 400 may fill at least a portion of a space between the lower and intermediate semiconductor chips 210 and 220 and may be disposed around the chip connection terminal 227. In an embodiment, the non-conductive layer 400 may enclose part or all of the chip connection terminal 227. The non-conductive layer 400 may have an extended portion 405, which protrudes from a side surface of the lower semiconductor chip 210 and a side surface of the intermediate semiconductor chip 220 in an outward direction. The extended portion 405 may be disposed on a portion of the side surface of the lower semiconductor chip 210 and a portion of the side surface of the intermediate semiconductor chip 220. In an embodiment, the extended portion 405 may cover a portion of the side surface of the lower semiconductor chip 210 and a portion of the side surface of the intermediate semiconductor chip 220. The extended portion 405 may be extended along the side surface of the lower semiconductor chip 210 in a downward direction and may be spaced apart from the top surface of the base semiconductor chip 100. The extended portion 405 may be extended along the side surface of the intermediate semiconductor chip 220 in an upward direction and may be spaced apart from a bottom surface of the upper semiconductor chip 230. In other words, the non-conductive layer 400 may, in an embodiment, not be in contact with the base semiconductor chip 100 and may, in an embodiment, not have a portion that is extended to the upper semiconductor chip 230. The non-conductive layer 400 may be a non-conductive film (NCF) or a non-conductive paste (NCP). The non-conductive layer 400 may be formed of or include an insulating polymer. For example, the non-conductive layer 400 may be formed of an epoxy-based material, in which conductive particles are not contained. Since the non-conductive layer 400 without conductive particles is used, it may be possible to prevent a short circuit issue from occurring between the chip connection terminals 227 and thereby to reduce a pitch of the chip connection terminals 227. In addition, the non-conductive layer 400 may serve as an under-filler pattern filling a space between the lower semiconductor chip 210 and the intermediate semiconductor chip 220, and thus, it may be possible to improve mechanical durability of the chip connection terminals 227.

A mold layer 500 may be provided on the base semiconductor chip 100. The mold layer 500 may be disposed on the top surface of the base semiconductor chip 100. In an embodiment, the mold layer 500 may cover the top surface of the base semiconductor chip 100. A side surface of the mold layer 500 may be aligned to a side surface of the base semiconductor chip 100. The mold layer 500 may be disposed around at least a portion of the chip stack CS. The mold layer 500 may be disposed around one or more of the side surfaces of the lower, intermediate, and upper semiconductor chips 210, 220, and 230. In an embodiment, the mold layer 500 may enclose the chip stack CS. The mold layer 500 may cover the side surfaces of the lower, intermediate, and upper semiconductor chips 210, 220, and 230. An outer side surface of the mold layer 500 may be spaced apart from the non-conductive layer 400. The mold layer 500 may be formed of or include an insulating material. For example, the mold layer 500 may be formed of or include an epoxy molding compound (EMC). Although not illustrated, the mold layer 500 may be disposed around portions or all of the lower, intermediate, and upper semiconductor chips 210, 220, and 230. For example, the mold layer 500 be disposed around a top surface of the upper semiconductor chip 230. Although not illustrated, the mold layer 500 may cover the lower, intermediate, and upper semiconductor chips 210, 220, and 230. The mold layer 500 may cover a top surface of the upper semiconductor chip 230. Although not illustrated, the mold layer 500 may be formed such that the top surface of the upper semiconductor chip 230 may remain exposed from the mold layer 500.

For a stack-type semiconductor package including a plurality of semiconductor chips stacked on a semiconductor substrate, the semiconductor chips 210, 220, and 230 may be vertically stacked on the base semiconductor chip 100. In this case, each of the semiconductor chips 210, 220, and 230 may exert a weight (i.e., a gravity by its mass) on another chip thereunder, and thus, the lowermost one of the semiconductor chips (i.e., the lower semiconductor chip 210) may experience the strongest pressure that is caused by the weight from other semiconductor chips thereon. In an embodiment where the non-conductive layer 400 is provided between the semiconductor chips 210, 220, and 230, a portion of the non-conductive layer 400 may protrude laterally from the side surfaces of the semiconductor chips 210, 220, and 230 due to the weights of the semiconductor chips. An increase of the weight may lead to an increase of a horizontal length of the protruding portion of the non-conductive layer 400 and an increase of an area of the side surface of the semiconductor chip covered with the protruding portion of the non-conductive layer 400. As an example, in the case where the non-conductive layer is provided between the lower and base semiconductor chips 210 and 100, a protruding portion of the non-conductive layer may be formed to have a large protruding length, owing to weights of the lower, intermediate, and upper semiconductor chips 210, 220, and 230. For example, the non-conductive layer may have a protruding portion that is formed to be adjacent to or in contact with the outer side surface of the mold layer 500 or is extended to a region on the outer side surface of the mold layer 500, and in this case, there may be a breakage issue between the base semiconductor chip 100 and the mold layer 500. Similarly, in the case where the non-conductive layer is provided between the intermediate and upper semiconductor chips 220 and 230, the non-conductive layer may have a protruding portion that is extended to a region on the top surface of the upper semiconductor chip 230, and this may lead to a breakage issue between the upper semiconductor chip 230 and the mold layer 500.

In an embodiment, the lower semiconductor chip 210, which is located at the lowermost level of the chip stack CS, may be directly connected to the base semiconductor chip 100 without any connection terminal therebetween, and, in an embodiment, there may not be a non-conductive layer provided between the lower and base semiconductor chips 210 and 100. Accordingly, in an embodiment, it may be possible to prevent a failure, which is caused by a non-conductive layer between the lower and base semiconductor chips 210 and 100, and thereby to realize a semiconductor package with improved structural stability.

Furthermore, the upper semiconductor chip 230, which is located at the uppermost level of the chip stack CS, may be directly connected to the intermediate semiconductor chip 220 without any connection terminal therebetween, and the non-conductive layer may not be provided between the upper and intermediate semiconductor chips 230 and 220. Accordingly, in an embodiment, it may be possible to prevent a failure, which is caused by a non-conductive layer between the upper and intermediate semiconductor chips 230 and 220, and thereby to realize a semiconductor package with improved structural stability.

Moreover, the intermediate semiconductor chip 220, which is located at an intermediate level of the chip stack CS, may be connected to the lower semiconductor chip 210 through the chip connection terminal 227, and the non-conductive layer 400 may be provided between the intermediate semiconductor chip 220 and the lower semiconductor chip 210. It may be possible to reduce the number of the non-conductive layers 400 provided in the chip stack CS and thereby to suppress a warpage issue, which is caused by the non-conductive layer 400 having a large thermal expansion coefficient. In other words, it may be possible to realize a semiconductor package with improved structural stability. In the chip stack CS, at least one pair of the semiconductor chips (e.g., 100/210 and/or 220/230) may be bonded to each other to form a hybrid bonding structure. When each of the semiconductor chips (i.e., 100/210 and/or 220/230) is provided to have a flat contact surface, it may be possible to realize a better hybrid bonding structure, and thus, for the proposed chip stack CS that is configured to have a suppressed warpage issue, it may be possible to prevent or suppress a detachment issue from occurring between the semiconductor chips (e.g., 100/210 and/or 220/230), which are bonded to each other to form the hybrid bonding structure. Furthermore, according to an embodiment, it may be possible to reduce the number of the hybrid bonding structures between the semiconductor chips (e.g., 100/210 and/or 220/230) provided in the chip stack CS. This may make it easy to perform the bonding process on the semiconductor chips (e.g., 100/210 and/or 220/230) in the chip stack CS.

In the description of the embodiments to be explained below, an element previously described with reference to FIGS. 1 and 2 may be identified by the same reference number without repeating an overlapping description thereof, for concise description.

Figure 3:
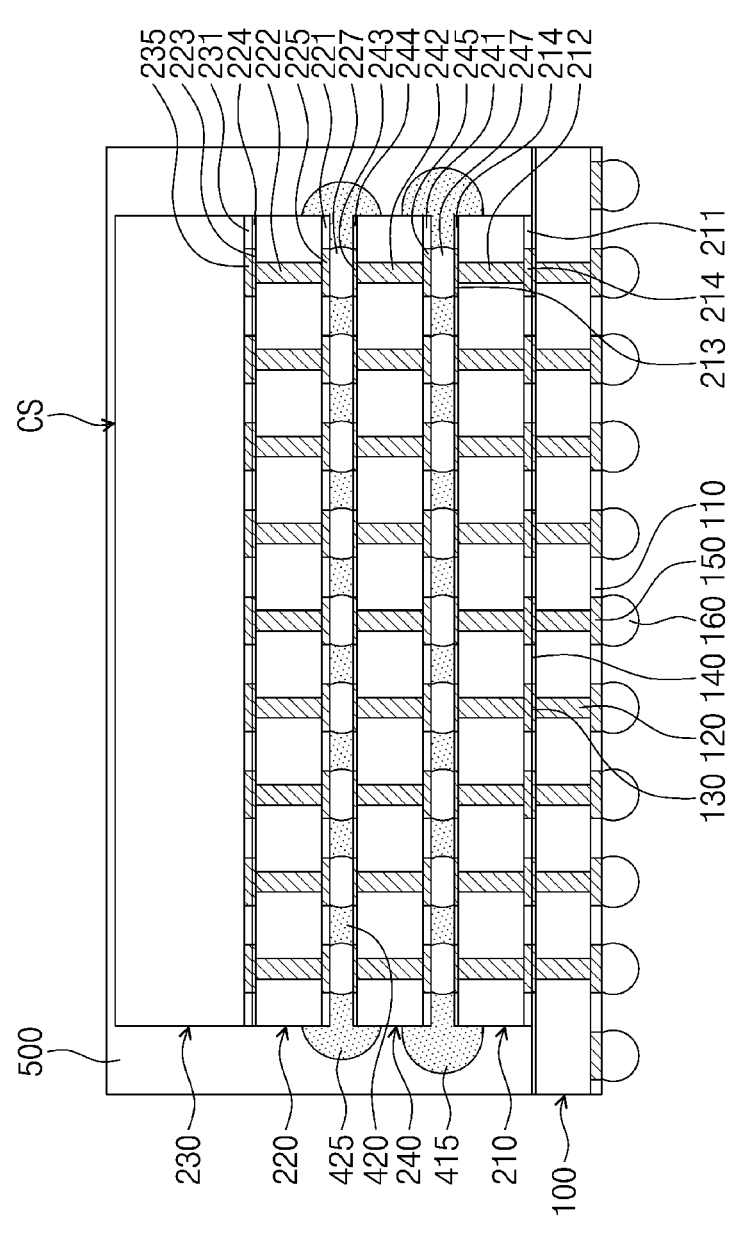

FIG. 3 is a cross-sectional view illustrating a semiconductor package according to an embodiment.

Referring to FIG. 3, the chip stack CS may be disposed on the base semiconductor chip 100. The chip stack CS may further include an additional semiconductor chip 240, which is disposed between the lower and intermediate semiconductor chips 210 and 220. The semiconductor chips 210, 220, 230, and 240 of the chip stack CS may be of the same kind. For example, the semiconductor chips 210, 220, 230, and 240 may be memory chips.

The lower semiconductor chip 210 may be mounted on the base semiconductor chip 100. For example, the lower semiconductor chip 210 may be disposed on the base semiconductor chip 100 face down, and at an interface of the lower and base semiconductor chips 210 and 100, the first rear pad 130 of the base semiconductor chip 100 may be bonded to the second front pad 215 of the lower semiconductor chip 210. Here, the first rear pad 130 and the second front pad 215 may form a metal-to-metal hybrid bonding structure.

The additional semiconductor chip 240 may have substantially the same structure as the lower semiconductor chip 210. For example, the additional semiconductor chip 240 may include a fifth circuit layer 241, which faces the base semiconductor chip 100, a fifth protection layer 244, which is opposite to the fifth circuit layer 241, a fifth via 242, which is provided to penetrate the additional semiconductor chip 240 in a direction from the fifth protection layer 244 toward the fifth circuit layer 241, a fifth rear pad 243, which is provided in the fifth protection layer 244, and a fifth front pad 245, which is provided on the fifth circuit layer 241. The fifth circuit layer 241 and the fifth front pad 245 may be provided on a bottom surface of the additional semiconductor chip 240, and the bottom surface of the additional semiconductor chip 240 may be an active surface. The fifth protection layer 244 and the fifth rear pad 243 may be provided on a top surface of the additional semiconductor chip 240.

The additional semiconductor chip 240 may be mounted on the lower semiconductor chip 210. For example, the additional semiconductor chip 240 may be disposed on the lower semiconductor chip 210 face down. The additional semiconductor chip 240 may be connected to the lower semiconductor chip 210 by a first chip connection terminal 247. The first chip connection terminal 247 may be disposed between the second rear pad 213 of the lower semiconductor chip 210 and the fifth front pad 245 of the additional semiconductor chip 240. The lower semiconductor chip 210 and the additional semiconductor chip 240 may be spaced apart from each other, and the first chip connection terminal 247 may have a thickness that is substantially equal to a distance between the second rear pad 213 and the fifth front pad 245. The first chip connection terminal 247 may connect the lower semiconductor chip 210 electrically to the additional semiconductor chip 240.

A first non-conductive layer 410 may be provided between the lower semiconductor chip 210 and the additional semiconductor chip 240. The first non-conductive layer 410 may be provided to fill a space between the lower semiconductor chip 210 and the additional semiconductor chip 240 and to enclose the first chip connection terminal 247. The first non-conductive layer 410 may have a first extended portion 415, which protrudes from a side surface of the lower semiconductor chip 210 and a side surface of the additional semiconductor chip 240 in an outward direction. The first extended portion 415 may be disposed on a portion of the side surface of the lower semiconductor chip 210 and a portion of the side surface of the additional semiconductor chip 240. In an embodiment, the first extended portion 415 may cover a portion of the side surface of the lower semiconductor chip 210 and a portion of the side surface of the additional semiconductor chip 240. The first extended portion 415 may be extended along the side surface of the lower semiconductor chip 210 in a downward direction and may be spaced apart from the top surface of the base semiconductor chip 100. In other words, the first non-conductive layer 410 may, in an embodiment, not be in contact with the base semiconductor chip 100.

The upper semiconductor chip 230 may be mounted on the intermediate semiconductor chip 220. For example, the upper semiconductor chip 230 may be disposed on the intermediate semiconductor chip 220 face down, and at an interface of the upper and intermediate semiconductor chips 230 and 220, the third rear pad 223 of the intermediate semiconductor chip 220 may be bonded to the fourth front pad 235 of the upper semiconductor chip 230. Here, the third rear pad 223 and the fourth front pad 235 may form a metal-to-metal hybrid bonding structure.

The intermediate semiconductor chip 220 may be mounted on the additional semiconductor chip 240. For example, the intermediate semiconductor chip 220 may be disposed on the additional semiconductor chip 240 face down. The intermediate semiconductor chip 220 may be connected to the additional semiconductor chip 240 by the second chip connection terminal 227. The second chip connection terminal 227 may be disposed between the fifth rear pad 243 of the additional semiconductor chip 240 and the third front pad 225 of the intermediate semiconductor chip 220. The additional semiconductor chip 240 and the intermediate semiconductor chip 220 may be spaced apart from each other, and a thickness of the second chip connection terminal 227 may be substantially equal to a distance between the fifth rear pad 243 and the third front pad 225. The second chip connection terminal 227 may connect the additional semiconductor chip 240 electrically to the intermediate semiconductor chip 220.

A second non-conductive layer 420 may be provided between the additional semiconductor chip 240 and the intermediate semiconductor chip 220. The second non-conductive layer 420 may be provided to fill a space between the additional semiconductor chip 240 and the intermediate semiconductor chip 220 and to enclose the second chip connection terminal 227. The second non-conductive layer 420 may have a second extended portion 425, which protrudes from the side surface of the additional semiconductor chip 240 and the side surface of the intermediate semiconductor chip 220 in an outward direction. A distance at which the second non-conductive layer 420 protrude (i.e., a horizontal width of the second extended portion 425) may be smaller than a width of the first extended portion 415. The second extended portion 425 may be disposed on a portion of the side surface of the additional semiconductor chip 240 and a portion of the side surface of the intermediate semiconductor chip 220. In an embodiment, the second extended portion 425 may cover a portion of the side surface of the additional semiconductor chip 240 and a portion of the side surface of the intermediate semiconductor chip 220. The second extended portion 425 may be extended along the side surface of the intermediate semiconductor chip 220 in an upward direction and may be spaced apart from the bottom surface of the upper semiconductor chip 230. In other words, the second non-conductive layer 420 may not be extended to a region on the upper semiconductor chip 230.

Figure 4:
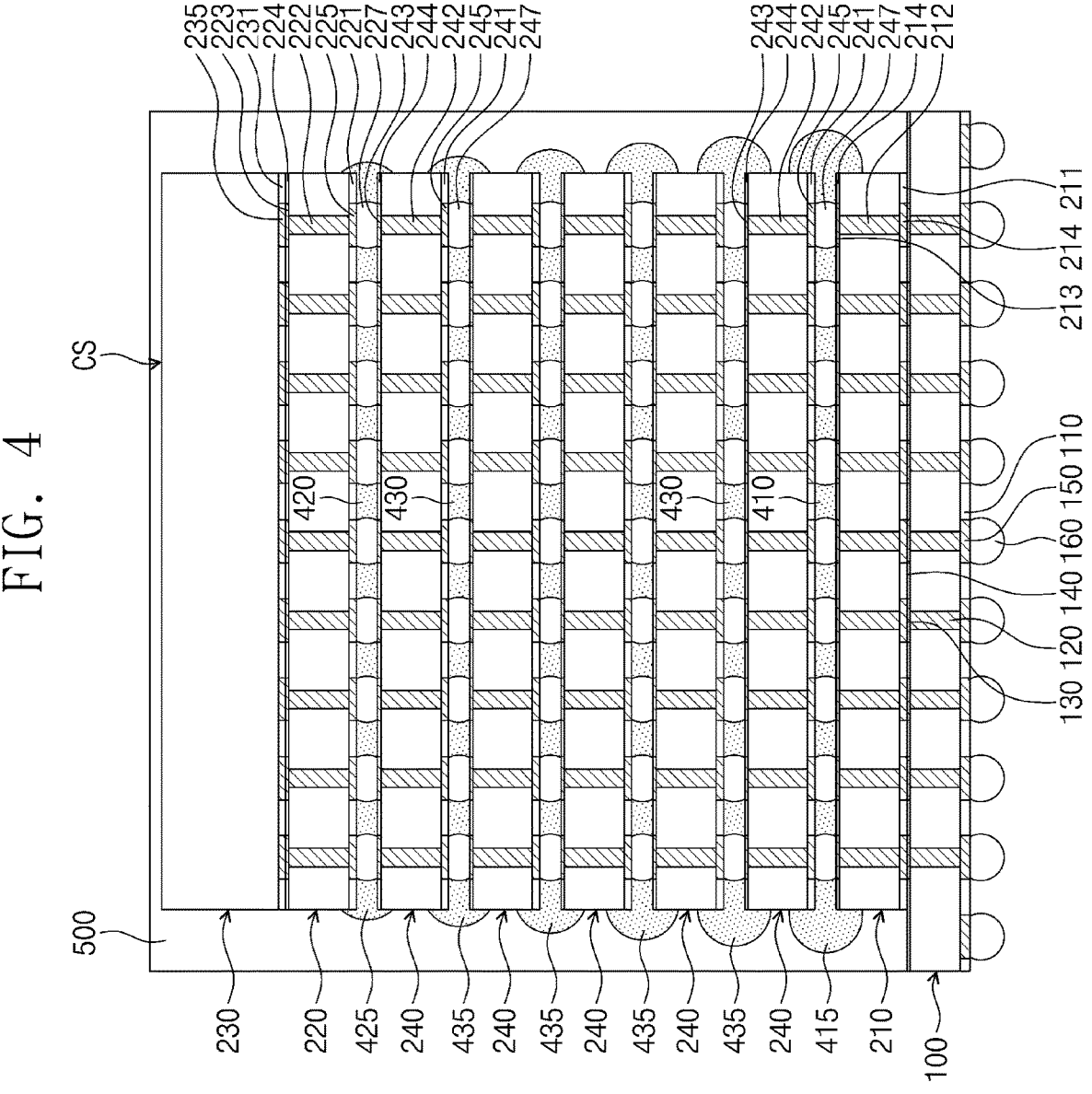

FIG. 4 is a cross-sectional view illustrating a semiconductor package according to an embodiment.

Referring to FIG. 4, a plurality of additional semiconductor chips 240 may be provided. The additional semiconductor chips 240 may be sequentially stacked between the lower and intermediate semiconductor chips 210 and 220. In the present embodiment, five additional semiconductor chips 240 are illustrated to be interposed between the lower and intermediate semiconductor chips 210 and 220, but embodiments not limited to this example. In an embodiment, two or more additional semiconductor chips 240 may be interposed between the lower and intermediate semiconductor chips 210 and 220.

Two adjacent ones of the additional semiconductor chips 240 may be connected to each other by a third chip connection terminal 249. The third chip connection terminal 249 may be disposed between the fifth rear pad 243 and the fifth front pad 245 facing each other. A thickness of the third chip connection terminal 249 may be equal to a distance between the fifth rear pad 243 and the fifth front pad 245. In an embodiment, a plurality of third chip connection terminals 249 may be provided. The third chip connection terminal 249 may connect adjacent ones of the additional semiconductor chips 240 electrically to each other.

A third non-conductive layer 430 may be provided between adjacent ones of the additional semiconductor chips 240. The third non-conductive layer 430 may be provided to fill a space between the adjacent ones of the additional semiconductor chips 240 and to enclose the third chip connection terminal 249. The third non-conductive layer 430 may have a third extended portion 435 which protrudes from the side surfaces of the additional semiconductor chips 240 in an outward direction. The third extended portion 435 may be disposed on a portion of the side surface of the additional semiconductor chip 240 adjacent thereto. In an embodiment, the third extended portion 435 may cover a portion of the side surface of the additional semiconductor chip 240 adjacent thereto. A distance at which the third non-conductive layer 430 protrude (i.e., a horizontal width of the third extended portion 435) may decrease as a distance from the base semiconductor chip 100 increases.

The lowermost one of the additional semiconductor chips 240 may be mounted on the lower semiconductor chip 210. For example, the lowermost one of the additional semiconductor chips 240 may be connected to the lower semiconductor chip 210 through the first chip connection terminal 247. The first non-conductive layer 410 may be provided between the lower semiconductor chip 210 and the lowermost one of the additional semiconductor chips 240. The first non-conductive layer 410 may be provided to fill a space between the lower semiconductor chip 210 and the lowermost one of the additional semiconductor chips 240 and to enclose the first chip connection terminal 247.

Figure 5:
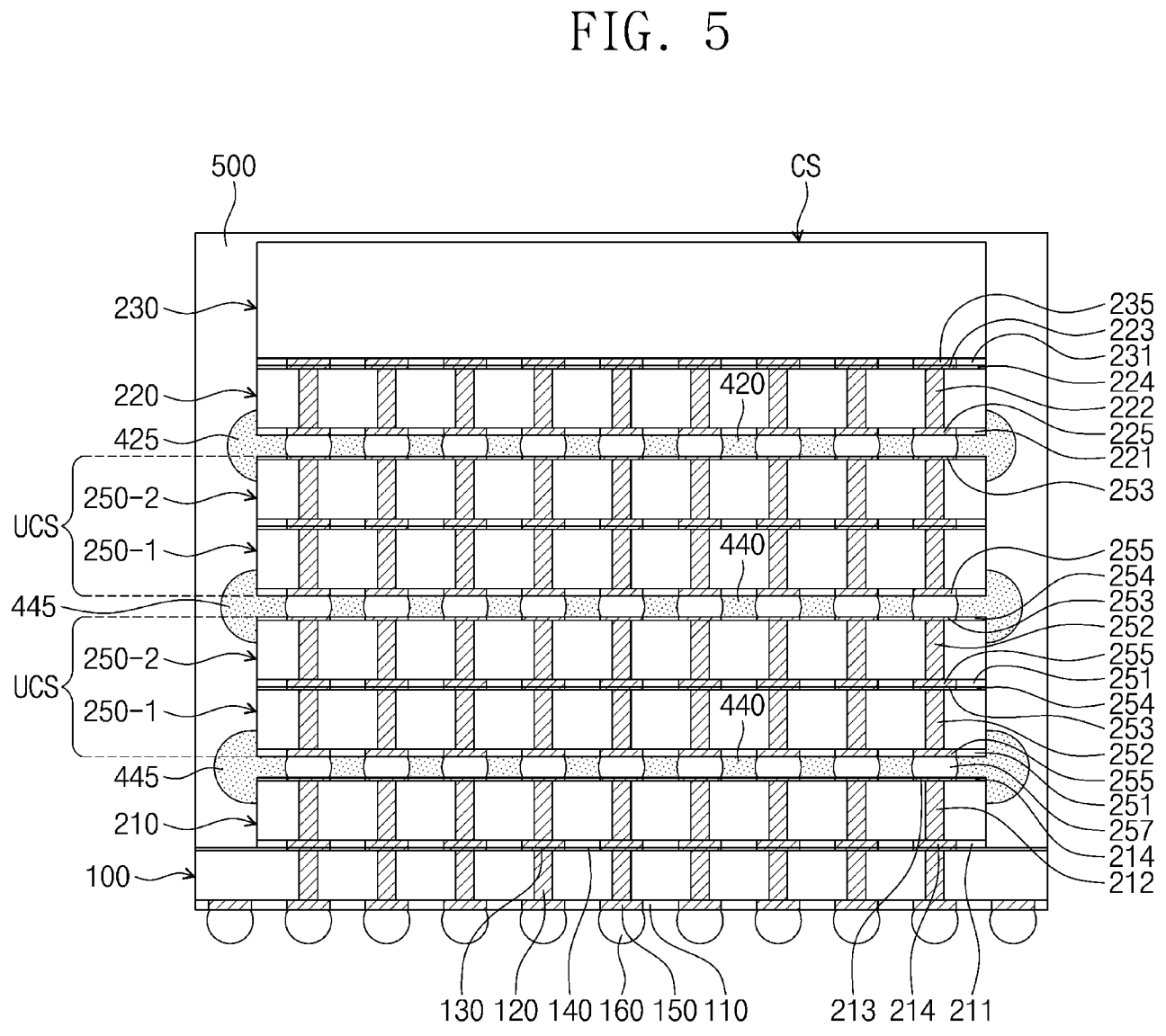
Figure 6:
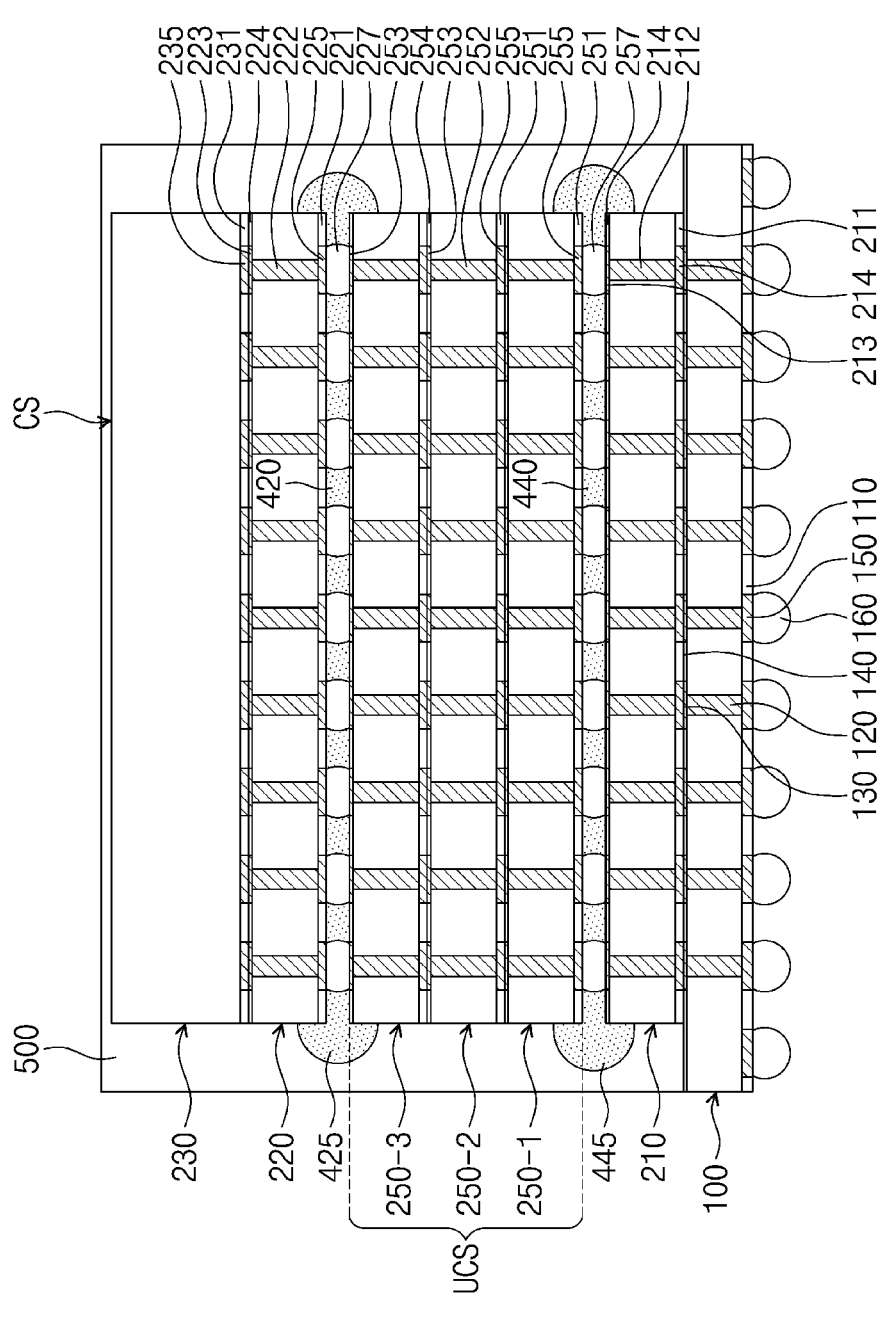

FIGS. 5 and 6 are cross-sectional views illustrating a semiconductor package according to an embodiment.

Referring to FIG. 5, the chip stack CS may be disposed on the base semiconductor chip 100. The chip stack CS may further include at least one chip structure UCS disposed between the lower and intermediate semiconductor chips 210 and 220. In the present embodiment, two chip structures UCS are illustrated to be interposed between the lower and intermediate semiconductor chips 210 and 220, but embodiments are not limited to this example. In an embodiment, one chip structure UCS may be provided between the lower and intermediate semiconductor chips 210 and 220 or three or more chip structures UCS may be interposed therebetween.

Each of the chip structures UCS may include two sub-semiconductor chips 250-1 and 250-2, which are bonded to each other. The sub-semiconductor chips 250 may be semiconductor chips, which are of the same kind as the lower, intermediate, and upper semiconductor chips 210, 220, and 230. For example, the sub-semiconductor chips 250-1 and 250-2 may be memory chips.

The sub-semiconductor chips 250-1 and 250-2 may have substantially the same structure as the lower semiconductor chip 210. For example, each of the sub-semiconductor chips 250-1 and 250-2 may include a sixth circuit layer 251, a sixth protection layer 254, which is opposite to the sixth circuit layer 251, a sixth via 252, which is provided to penetrate the same (i.e., 250-1 or 250-2) in a direction from the sixth protection layer 254 toward the sixth circuit layer 251, a sixth rear pad 253, which is provided in the sixth protection layer 254, and a sixth front pad 255, which is provided on the sixth circuit layer 251. The sixth circuit layer 251 and the sixth front pad 255 may be provided on active surfaces of the sub-semiconductor chips 250-1 and 250-2. The sixth protection layer 254 and the sixth rear pad 253 may be provided on inactive surfaces of the sub-semiconductor chips 250-1 and 250-2.

Two sub-semiconductor chips 250-1 and 250-2 may be stacked in each chip structure UCS. The active surface of one of the sub-semiconductor chips (e.g., 250-2) may be bonded to the inactive surface of another one of the sub-semiconductor chips (e.g., 250-1). In other words, the sub-semiconductor chips 250-1 and 250-2 may be bonded to each other in a face-to-back manner. In detail, the sub-semiconductor chips 250-1 and 250-2, which are adjacent to each other, may be in contact with each other. At an interface of the sub-semiconductor chips 250-1 and 250-2, the sixth front pad 255 may be bonded to the sixth rear pad 253. Here, the sixth front pad 255 and the sixth rear pad 253 may form a metal-to-metal hybrid bonding structure.

In the present embodiment, the chip structure UCS has been described to include two sub-semiconductor chips 250-1 and 250-2, but embodiments are not limited to this example. For example, as shown in FIG. 6, three sub-semiconductor chips 250-1, 250-2, and 250-3 may be sequentially stacked in one chip structure UCS. The active surface of the second sub-semiconductor chip 250-2 may be bonded to the inactive surface of the first sub-semiconductor chip 250-1, and the active surface of the third sub-semiconductor chip 250-3 may be bonded to the inactive surface of the second sub-semiconductor chip 250-2. In other words, the sub-semiconductor chips 250-1, 250-2, and 250-3 may be bonded to each other in a face-to-back manner. In an embodiment, the chip structures UCS may include four or more sub-semiconductor chips 250. The following description will be given based on the embodiment of FIG. 5.

Fourth chip connection terminals 257 may be provided on a bottom surfaces of the chip structures UCS. For example, the fourth chip connection terminal 257 may be disposed on the sixth front pad 255 provided on the bottom surfaces of the chip structures UCS (i.e., on the sixth front pad 255 of a lower one 250-1 of the sub-semiconductor chips). Adjacent ones of the lower semiconductor chip 210 and the chip structures UCS may be connected to each other by the fourth chip connection terminals 257. For example, the fourth chip connection terminals 257 may connect the second rear pad 213 and the sixth front pad 255, which are provided to face each other, between the lower semiconductor chip 210 and the chip structure UCS adjacent thereto or may connect the sixth rear pad 253 and the sixth front pad 255, which are provided to face each other, between adjacent ones of the chip structures UCS.

A fourth non-conductive layer 440 may be provided on the bottom surface of the chip structure UCS. For example, the fourth non-conductive layer 440 may be provided below the chip structure UCS to enclose the fourth chip connection terminal 257. The fourth non-conductive layer 440 may fill part or all of a space between the lower semiconductor chip 210 and the chip structure UCS, which are adjacent to each other, or may fill all or part of a space between the chip structures UCS, which are adjacent to each other. The fourth non-conductive layer 440 may have a fourth extended portion 445, which protrudes from the side surface of the additional the chip structure UCS in an outward direction.

The intermediate semiconductor chip 220 may be mounted on the chip structures UCS. For example, the intermediate semiconductor chip 220 may be disposed on the uppermost one of the chip structures UCS in a face down manner. The intermediate semiconductor chip 220 may be connected to the uppermost one of the chip structures UCS by the second chip connection terminal 227. The second chip connection terminal 227 may be disposed between the sixth rear pad 253 of the uppermost one of the chip structures UCS and the third front pad 225 of the intermediate semiconductor chip 220.

The second non-conductive layer 420 may be provided between the uppermost one of the chip structures UCS and the intermediate semiconductor chip 220. The second non-conductive layer 420 may fill all or part of a space between the uppermost one of the chip structures UCS and the intermediate semiconductor chip 220 and may enclose the second chip connection terminal 227. The second non-conductive layer 420 may have a second extended portion 425, which protrudes from the side surface of the uppermost one of the chip structures UCS and the side surface of the intermediate semiconductor chip 220 in an outward direction. A length of the protruding portion of the second non-conductive layer 420 (i.e., a horizontal length of the second extended portion 425) may be smaller than a width of the extended portion of the fourth non-conductive layer 440.

Figure 7:
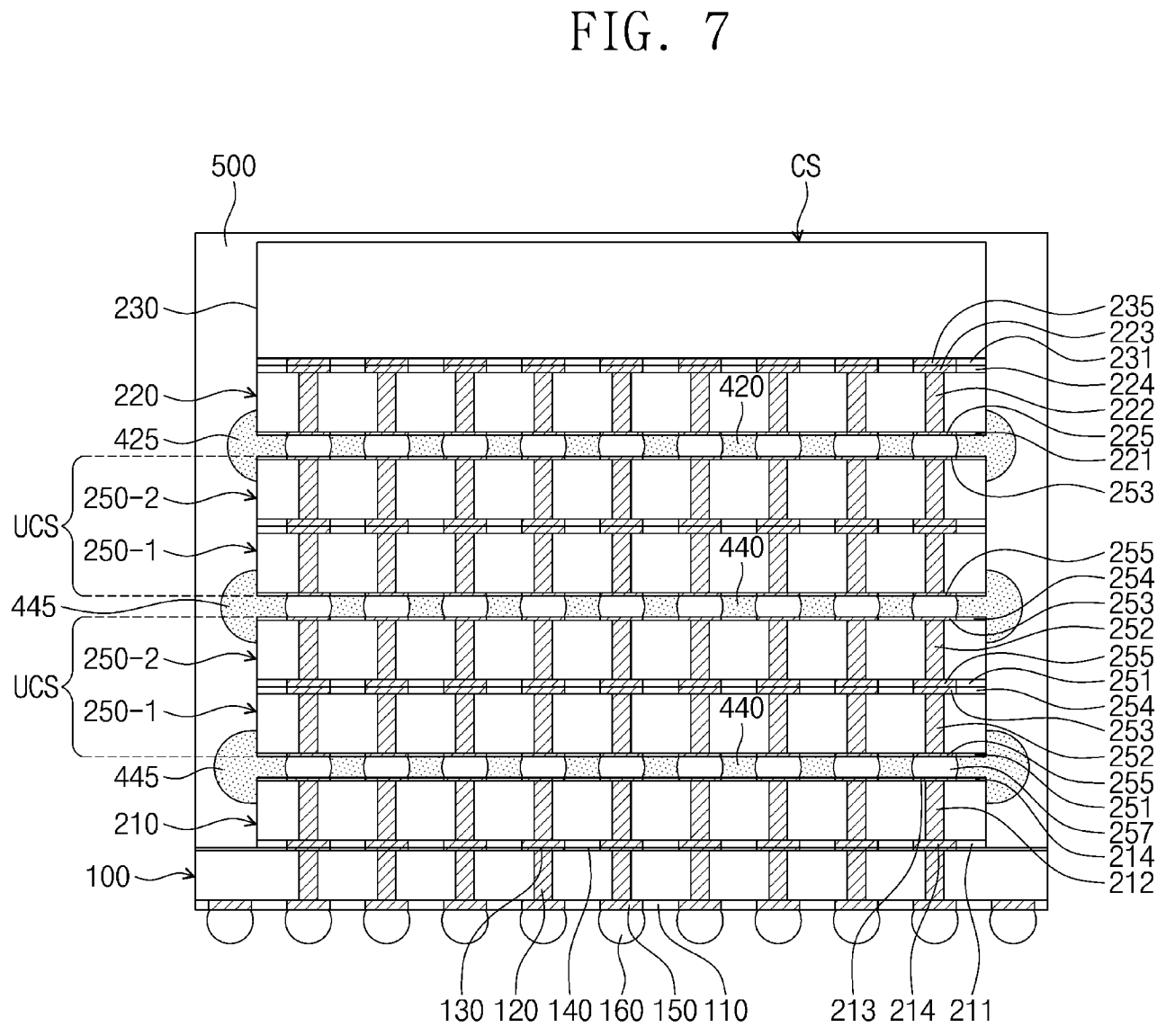

FIG. 7 is a cross-sectional view illustrating a semiconductor package according to an embodiment.

FIGS. 5 and 6 illustrate examples, in which the sub-semiconductor chips 250 in one chip structure UCS are bonded to each other in a face-to-back manner, but embodiments are not limited to this example.

Referring to FIG. 7, an active surface of one sub-semiconductor chip (e.g., 250-2) may be bonded to an active surface of another sub-semiconductor chip (e.g., 250-1). In other words, the sub-semiconductor chips 250 may be bonded to each other in a face-to-face manner. In detail, the sub-semiconductor chips 250-1 and 250-2, which are adjacent to each other, may be in contact with each other. At an interface between the sub-semiconductor chips 250-1 and 250-2, the sixth front pads 255 facing each other may be bonded to each other. Here, the sixth front pads 255 may form a metal-to-metal hybrid bonding structure.

The fourth chip connection terminal 257 may be provided on the bottom surfaces of the chip structures UCS. For example, the fourth chip connection terminal 257 may be disposed on the sixth rear pad 253 provided on the bottom surfaces of the chip structures UCS (e.g., on the sixth rear pad 253 of the lower one 250-1 of the sub-semiconductor chips 250-1 and 250-2). Adjacent ones of the lower semiconductor chip 210 and the chip structures UCS may be connected to each other by the fourth chip connection terminals 257. For example, the fourth chip connection terminals 257 may connect the second rear pad 213 and the sixth rear pad 253, which are provided to face each other, between the lower semiconductor chip 210 and the chip structure UCS adjacent thereto or may connect the sixth rear pad 253 and the sixth rear pads 253, which are provided to face each other, between adjacent ones of the chip structures UCS.

The intermediate semiconductor chip 220 may be mounted on the chip structures UCS. For example, the intermediate semiconductor chip 220 may be disposed on the uppermost one of the chip structures UCS face down. The intermediate semiconductor chip 220 may be connected to the uppermost one of the chip structures UCS by the second chip connection terminal 227. The second chip connection terminal 227 may be disposed between the sixth rear pad 253 of the uppermost one of the chip structures UCS and the third front pad 225 of the intermediate semiconductor chip 220.

According to an embodiment, the semiconductor chips in the chip stack CS may be stacked on the base semiconductor chip 100, and here, the non-conductive layers may or may not be disposed between the semiconductor chips in an alternate manner. When the non-conductive layers protrude from the side surface of the chip stack CS, the non-conductive layers may not be in contact with each other, and a volume of the protruding portion of the non-conductive layer may be reduced. Accordingly, it may be possible to realize a semiconductor package with improved structural stability.

Figure 8:
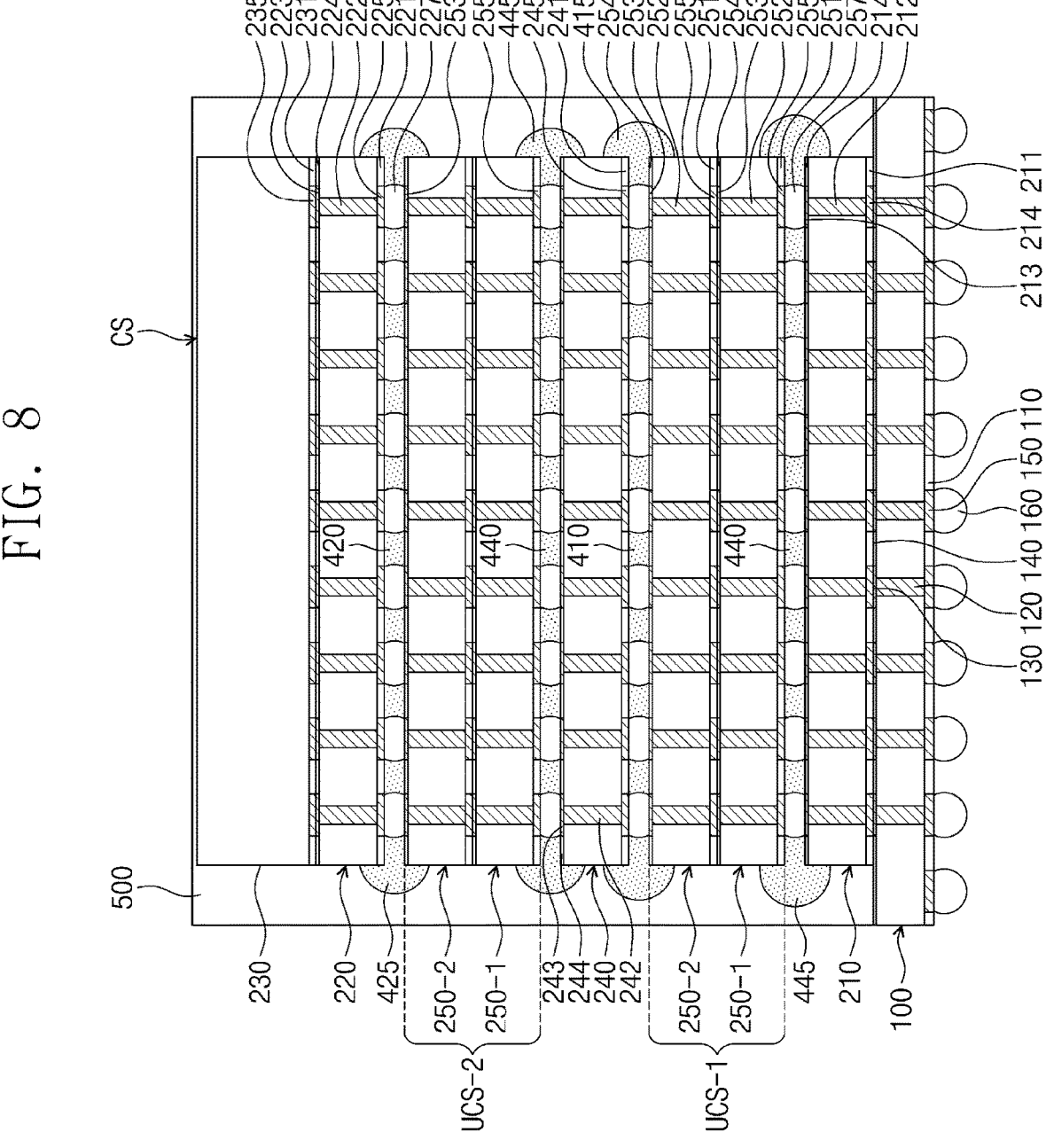

FIG. 8 is a cross-sectional view illustrating a semiconductor package according to an embodiment.

Referring to FIG. 8, the chip stack CS may be disposed on the base semiconductor chip 100. The chip stack CS may include chip structures UCS-1 and UCS-2 and an additional semiconductor chip 240 disposed therebetween. The additional semiconductor chip 240 may be provided to have substantially the same or similar features as the additional semiconductor chip 240 described with reference to FIG. 3.

The additional semiconductor chip 240 may be mounted on one (e.g., UCS-1) of the chip structures UCS-1 and UCS-2. For example, the additional semiconductor chip 240 may be disposed on the chip structure UCS-1 thereunder in a face down manner. The additional semiconductor chip 240 may be connected to the chip structure UCS-1 by the first chip connection terminal 247. The first chip connection terminal 247 may be disposed between the sixth rear pad 253 of the chip structure UCS-1 and the fifth front pad 245 of the additional semiconductor chip 240.

The first non-conductive layer 410 may be provided between the additional semiconductor chip 240 and the chip structure UCS-1 thereunder. The first non-conductive layer 410 may be provided to fill a space between the additional semiconductor chip 240 and the chip structure UCS-1 and to enclose the first chip connection terminal 247.

Another (e.g., UCS-2) of the chip structures UCS-1 and UCS-2 may be mounted on the additional semiconductor chip 240. For example, the chip structure UCS-2 may be disposed on the additional semiconductor chip 240 in a face down manner. The chip structure UCS-2 may be connected to the additional semiconductor chip 240 by the fourth chip connection terminal 257. The fourth chip connection terminal 257 may be disposed between the fifth rear pad 243 of the additional semiconductor chip 240 and the sixth front pad 255 of the chip structure UCS-2 thereon.

The fourth non-conductive layer 440 may be provided between the additional semiconductor chip 240 and the chip structure UCS-2 thereon. The fourth non-conductive layer 440 may be provided to fill a space between the additional semiconductor chip 240 and the chip structure UCS-2 and to enclose the fourth chip connection terminal 257.

FIG. 8 illustrates an example including two chip structures UCS-1 and UCS-2 and one additional semiconductor chip 240 therebetween, but embodiments are not limited to this example. For example, in an embodiment, a plurality of chip structures and a plurality of additional semiconductor chips 240 may be provided. In this case, the chip structures and the additional semiconductor chips 240 may be stacked on top of each other in an alternate manner.

Figure 9:
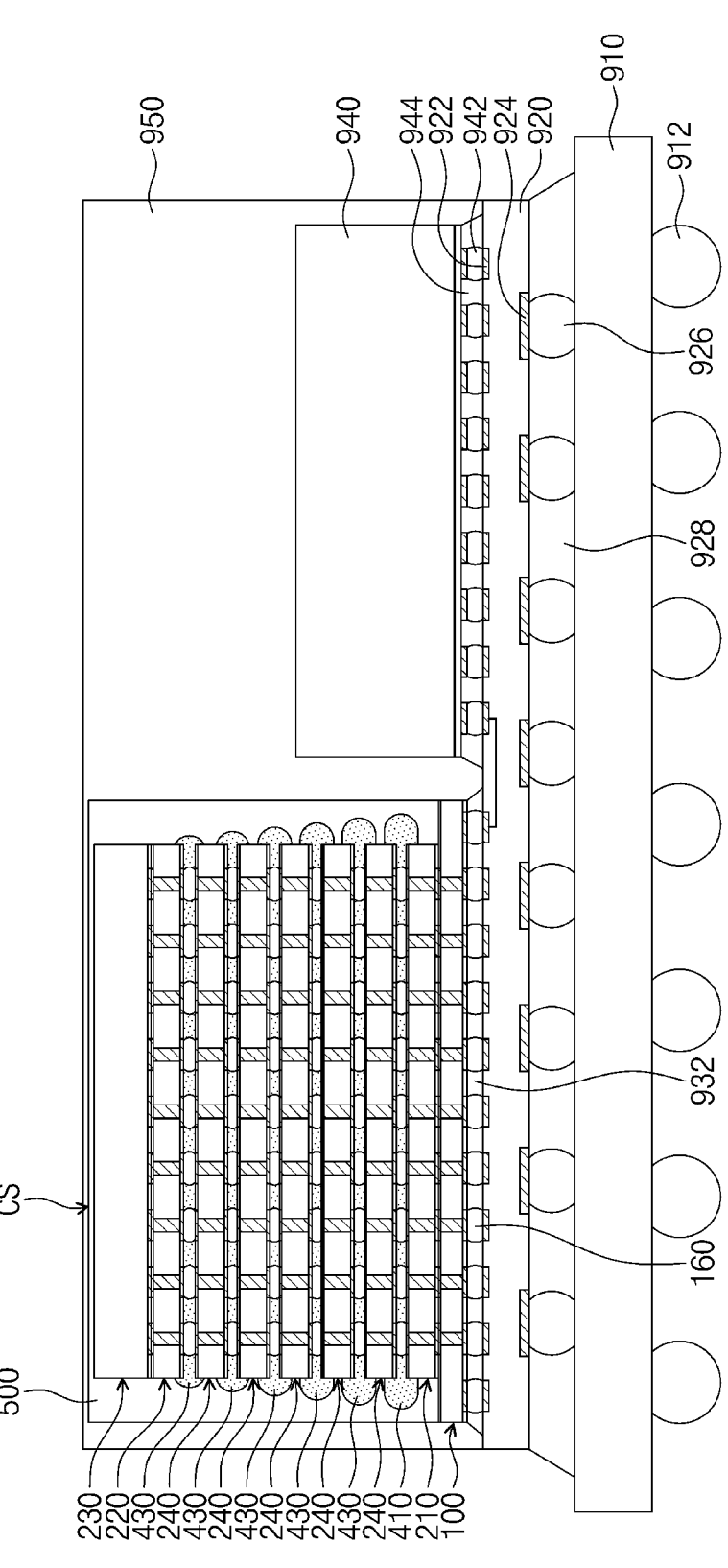
FIG. 9 is a cross-sectional view illustrating a semiconductor module according to an embodiment.

FIG. 9 is a cross-sectional view illustrating a semiconductor module according to an embodiment.

Referring to FIG. 9, a semiconductor module may include, for example, a memory module including a module substrate 910, a chip stack package CS and a graphics processing unit (GPU) 940, which are mounted on the module substrate 910, and an outer mold layer 950 disposed on the chip stack package CS and the graphics processing unit 940. In an embodiment, an outer mold layer 950 may cover the chip stack package CS and the graphics processing unit 940. The semiconductor module may further include an interposer 920 provided on the module substrate 910.

The module substrate 910 may be provided. The module substrate 910 may include a printed circuit board (PCB) having signal patterns, which are formed on a top surface thereof.

Module terminals 912 may be disposed under the module substrate 910. The module substrate 910 may include solder balls or solder bumps, and the semiconductor module may be classified into a ball grid array (BGA) type, a fine ball-grid array (FBGA) type, or a land grid array (LGA) type, depending on the kind and structure of the module substrate 910.

The interposer 920 may be provided on the module substrate 910. The interposer 920 may include first substrate pads 922 and second substrate pads 924, which are respectively placed near top and bottom surfaces of the interposer 920 and are exposed to the outside of the interposer 920. The interposer 920 may be configured to provide a redistribution structure for the chip stack package CS and the graphics processing unit 940. The interposer 920 may be mounted on the module substrate 910 in a flip chip manner. For example, the interposer 920 may be mounted on the module substrate 910 using substrate terminals 926, which are provided on the second substrate pads 924. The substrate terminals 926 may include solder balls or solder bumps. A first under fill layer 928 may be provided between the module substrate 910 and the interposer 920.

The chip stack package CS may be disposed on the interposer 920. The chip stack package CS may have the same or similar structure as the semiconductor package described with reference to FIGS. 1, 2, 3, 4, 5, 6, 7, and 8.

The chip stack package CS may be mounted on the interposer 920. For example, the chip stack package CS may be coupled to the first substrate pads 922 of the interposer 920 through the outer terminals 160 of the base semiconductor chip 100. A second under fill layer 932 may be provided between the chip stack package CS and the interposer 920. The second under fill layer 932 may be provided to fill a space between the interposer 920 and the base semiconductor chip 100 and to enclose the outer terminals 160 of the base semiconductor chip 100.

The graphics processing unit 940 may be disposed on the interposer 920. The graphics processing unit 940 may be disposed to be spaced apart from the chip stack package CS. The graphics processing unit 940 may be thicker than the semiconductor chips 100, 210, 220, 230, and 240 of the chip stack package CS. The graphics processing unit 940 may include a logic circuit. In other words, the graphics processing unit 940 may be a logic chip. Bumps 942 may be provided on a bottom surface of the graphics processing unit 940. For example, the graphics processing unit 940 may be coupled to the first substrate pads 922 of the interposer 920 through the bumps 942. A third under fill layer 944 may be provided between the interposer 920 and the graphics processing unit 940. The third under fill layer 944 may be provided to fill a space between the interposer 920 and the graphics processing unit 940 and to enclose the bumps 942.

The outer mold layer 950 may be provided on the interposer 920. The outer mold layer 950 may cover a top surface of the interposer 920. The outer mold layer 950 may enclose the chip stack package CS and the graphics processing unit 940. A top surface of the outer mold layer 950 may be located at the same level as a top surface of the chip stack package CS. The outer mold layer 950 may be formed of or include an insulating material. For example, the outer mold layer 950 may be formed of or include an epoxy molding compound (EMC).

FIGS. 10, 11, 12, 13, 14, 15, 16, and 17 are cross-sectional views illustrating a method of fabricating a semiconductor package, according to an embodiment.

Figures 10, 11:
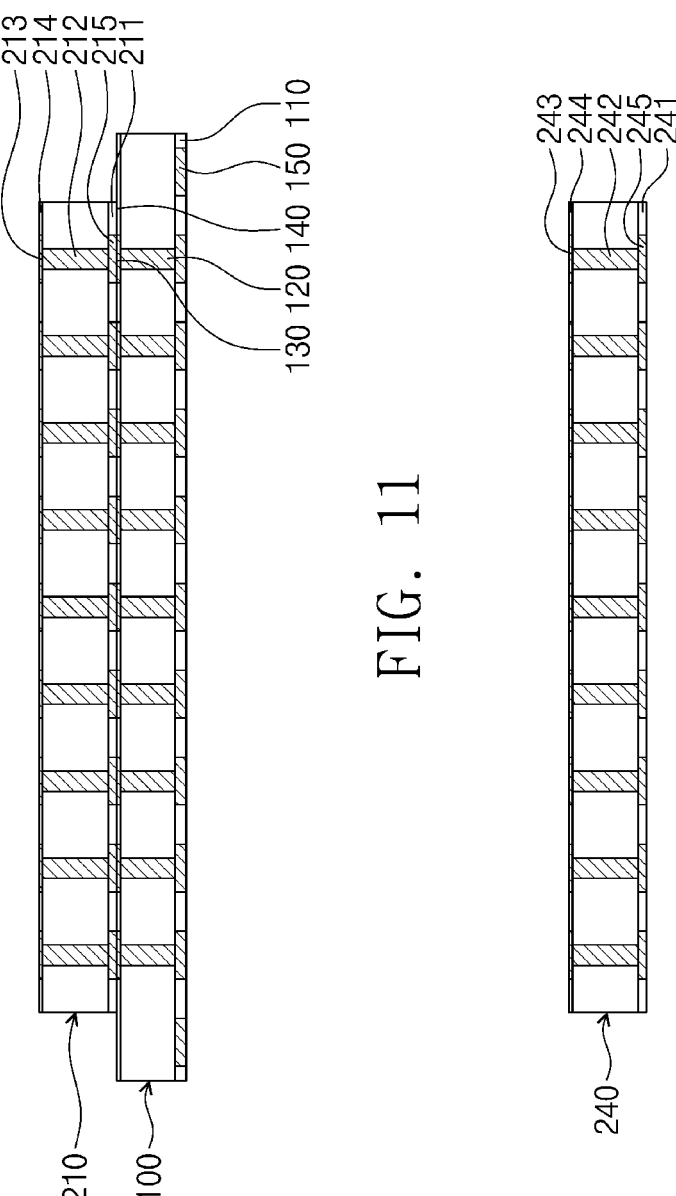
FIGS. 10, 11, 12, 13, 14, 15, 16, 17, 18, 19, and 20 are cross-sectional views illustrating a method of fabricating a semiconductor package according to an embodiment.

Referring to FIG. 10, the base semiconductor chip 100 may be provided. The base semiconductor chip 100 may be provided to have substantially the same or similar features as the base semiconductor chip 100 described with reference to FIG. 1. For example, the base semiconductor chip 100 may include the first circuit layer 110, which is provided on a surface of the base semiconductor chip 100, the first protection layer 140, which is opposite to the first circuit layer 110, the first via 120, which is provided to penetrate the base semiconductor chip 100 in a direction from the first protection layer 140 toward the first circuit layer 110, the first rear pad 130, which is provided in the first protection layer 140, and the first front pad 150, which is provided on the first circuit layer 110. The first circuit layer 110 may be provided on an active surface of the base semiconductor chip 100, and hereinafter, a surface opposite to the active surface will be referred to as an inactive surface of the first circuit layer 110.

Although not shown, the base semiconductor chip 100 may be provided on a carrier substrate. The carrier substrate may be an insulating substrate, which is formed of or includes glass or polymer, or a conductive substrate, which is formed of or includes a metallic material. An adhesive member may be provided on a top surface of the carrier substrate. The base semiconductor chip 100 may be attached to the carrier substrate such that the first circuit layer 110 faces the carrier substrate.

The lower semiconductor chip 210 may be provided on the base semiconductor chip 100. The lower semiconductor chip 210 may be provided to have substantially the same or similar features as the lower semiconductor chip 210 described with reference to FIG. 1. For example, the lower semiconductor chip 210 may include the second circuit layer 211, which is provided on a surface of the lower semiconductor chip 210, the second protection layer 214, which is opposite to the second circuit layer 211, the second via 212, which is provided to penetrate the lower semiconductor chip 210 in a direction from the second protection layer 214 toward the second circuit layer 211, the second rear pad 213, which is provided in the second protection layer 214, and the second front pad 215, which is provided on the second circuit layer 211. The second circuit layer 211 may be provided on an active surface of the lower semiconductor chip 210, and hereinafter, a surface opposite to the active surface will be referred to as an inactive surface of the lower semiconductor chip 210.

The lower semiconductor chip 210 may be bonded to the base semiconductor chip 100. The lower and base semiconductor chips 210 and 100 may be bonded to each other in a chip-to-chip manner. The lower semiconductor chip 210 may be disposed on the base semiconductor chip 100. For example, the active surface of the lower semiconductor chip 210 may face an inactive surface of the base semiconductor chip 100. The lower semiconductor chip 210 may be disposed on the base semiconductor chip 100 such that the first rear pad 130 of the base semiconductor chip 100 is vertically aligned to the second front pad 215 of the lower semiconductor chip 210.

A thermal treatment process may be performed on the base semiconductor chip 100 and the lower semiconductor chip 210. As a result of the thermal treatment process, the first rear pad 130 and the second front pad 215 may be bonded to each other. For example, the first rear pad 130 and the second front pad 215 may be bonded or coupled to each other to form a single structure or layer without an interface therebetween. The bonding of the first rear pad 130 and the second front pad 215 may be achieved in a natural manner. In detail, the first rear pad 130 and the second front pad 215 may be formed of the same material (e.g., copper (Cu)), and in this case, the first rear pad 130 and the second front pad 215 may be bonded to each other by a surface activation phenomenon at an interface of the first rear pad 130 and the second front pad 215, which are in contact with each other, or by the consequent metal-to-metal hybrid bonding process. The first protection layer 140 and the insulating pattern of the second circuit layer 211 may be bonded to each other by the thermal treatment process.

FIG. 10 illustrates an example, in which one lower semiconductor chip 210 is bonded to one base semiconductor chip 100, or in which the base semiconductor chip 100 and the lower semiconductor chip 210 are bonded to each other in a chip-to-chip shape, but embodiments are not limited to this example. In an embodiment, the base semiconductor chip 100 and the lower semiconductor chip 210 may be bonded to each other in a chip-to-wafer shape. For example, the lower semiconductor chips 210 may be bonded to a semiconductor wafer provided with the base semiconductor chips 100, and then, a sawing process may be performed on the semiconductor wafer to form a plurality of base semiconductor chips 100, which are separated from each other.

Referring to FIG. 11, the additional semiconductor chip 240 may be provided. The additional semiconductor chip 240 may be provided to have substantially the same or similar features as the additional semiconductor chip 240 described with reference to FIG. 4. For example, the additional semiconductor chip 240 may include the fifth circuit layer 241, which is provided on a surface of the additional semiconductor chip 240, the fifth protection layer 244, which is opposite to the fifth circuit layer 241, the fifth via 242, which is provided to penetrate the additional semiconductor chip 240 in a direction from the fifth protection layer 244 toward the fifth circuit layer 241, the fifth rear pad 243, which is provided in the fifth protection layer 244, and the fifth front pad 245, which is provided on the fifth circuit layer 241. The fifth circuit layer 241 may be provided on an active surface of the additional semiconductor chip 240, and hereinafter, a surface opposite to the active surface will be referred to as an inactive surface of the additional semiconductor chip 240.

Figure 12:
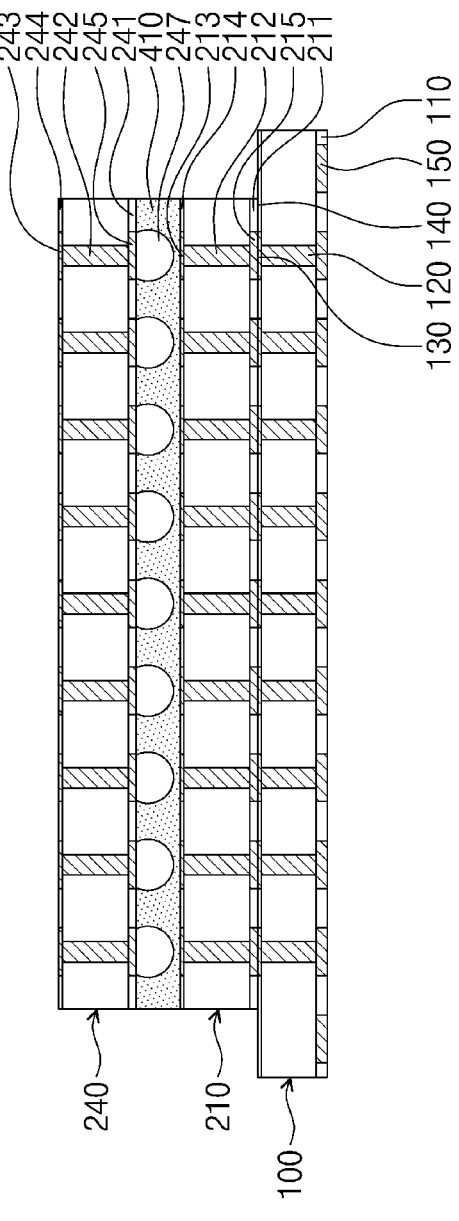

Referring to FIG. 12, the additional semiconductor chip 240 may be provided on the lower semiconductor chip 210. In more detail, the first chip connection terminal 247 and the first non-conductive layer 410 enclosing the same may be provided on a bottom surface (i.e., an active surface) of the additional semiconductor chip 240. For example, the first chip connection terminal 247 may be provided on the fifth front pad 245 of the fifth circuit layer 241 of the additional semiconductor chip 240. The first non-conductive layer 410 may be a non-conductive film (NCF) or a non-conductive paste (NCP). In the case where the first non-conductive layer 410 is the non-conductive paste, the first non-conductive layer 410 may be formed by a dispensing process of coating the additional semiconductor chip 240 with a liquid non-conductive adhesive agent. In the case where the first non-conductive layer 410 is the non-conductive film, the first non-conductive layer 410 may be formed by attaching a non-conductive film to the additional semiconductor chip 240. In other words, the first non-conductive layer 410 may be provided on the inactive surface of the lower semiconductor chip 210, and the additional semiconductor chip 240 may be provided on the first non-conductive layer 410.

Figure 13:
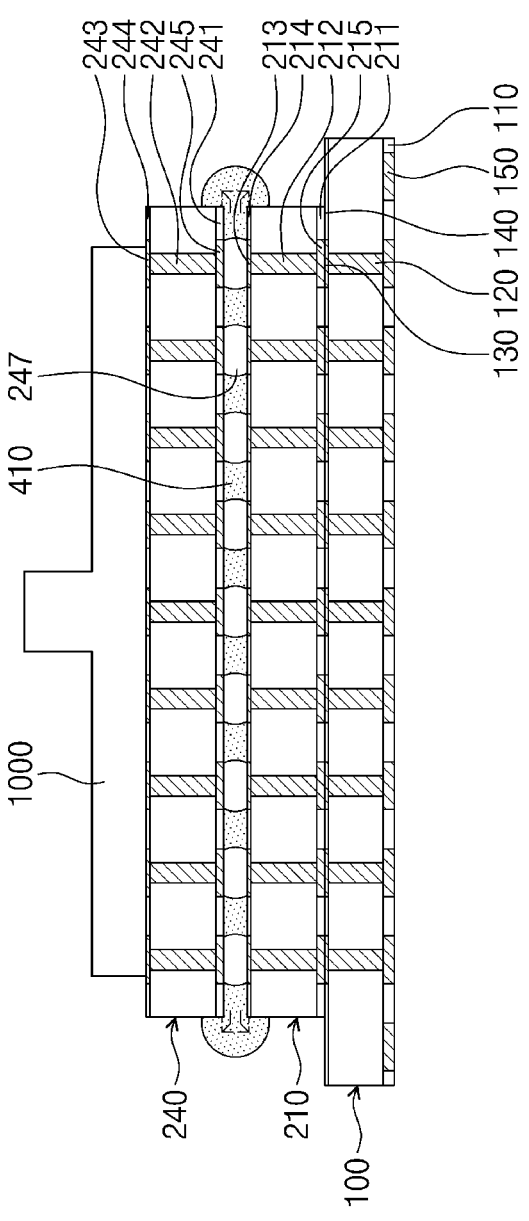

Referring to FIG. 13, a thermocompression bonding process may be performed to bond the additional semiconductor chip 240 to the lower semiconductor chip 210. The first chip connection terminal 247 may be provided to electrically connect the lower semiconductor chip 210 to the additional semiconductor chip 240. As an example, a width of a bonding tool 1000, which is used in the bonding process, may be smaller than a width of the additional semiconductor chip 240. In the case where the additional semiconductor chip 240 is compressed toward the lower semiconductor chip 210, the first non-conductive layer 410 may protrude from the side surface of the lower semiconductor chip 210 in an outward direction. The protruding portion of the first non-conductive layer 410 may form the first extended portion 415 (e.g., of FIG. 4). Here, a portion of the first extended portion 415 may be extended to the side surface of the lower semiconductor chip 210 to cover a portion of the side surface of the lower semiconductor chip 210. Thicknesses of the first extended portions 415 may be larger than a distance between the lower semiconductor chip 210 and the additional semiconductor chip 240.

In the case where the thermocompression process is lasted, the first non-conductive layer 410 may be partially cured by heat, which is provided to the additional semiconductor chip 240.

In the case where the lower semiconductor chip 210 is mounted on the base semiconductor chip 100 with a non-conductive layer interposed therebetween, the lower semiconductor chip 210 may be detached from the base semiconductor chip 100 by the protrusion of the non-conductive layer in the thermocompression bonding process. According to an embodiment, the lower semiconductor chip 210 may be bonded to the base semiconductor chip 100 to be in direct contact with each other, and then, the additional semiconductor chip 240 may be mounted on the lower semiconductor chip 210 with the first non-conductive layer 410 interposed therebetween. Since the first non-conductive layer 410 is formed to be spaced apart from the base semiconductor chip 100, it may be possible to prevent the semiconductor chips 210 and 240 from being detached from the base semiconductor chip 100 by the protrusion of the first non-conductive layer 410. This may make it possible to reduce a failure in a process of fabricating a semiconductor package.

Figure 14:
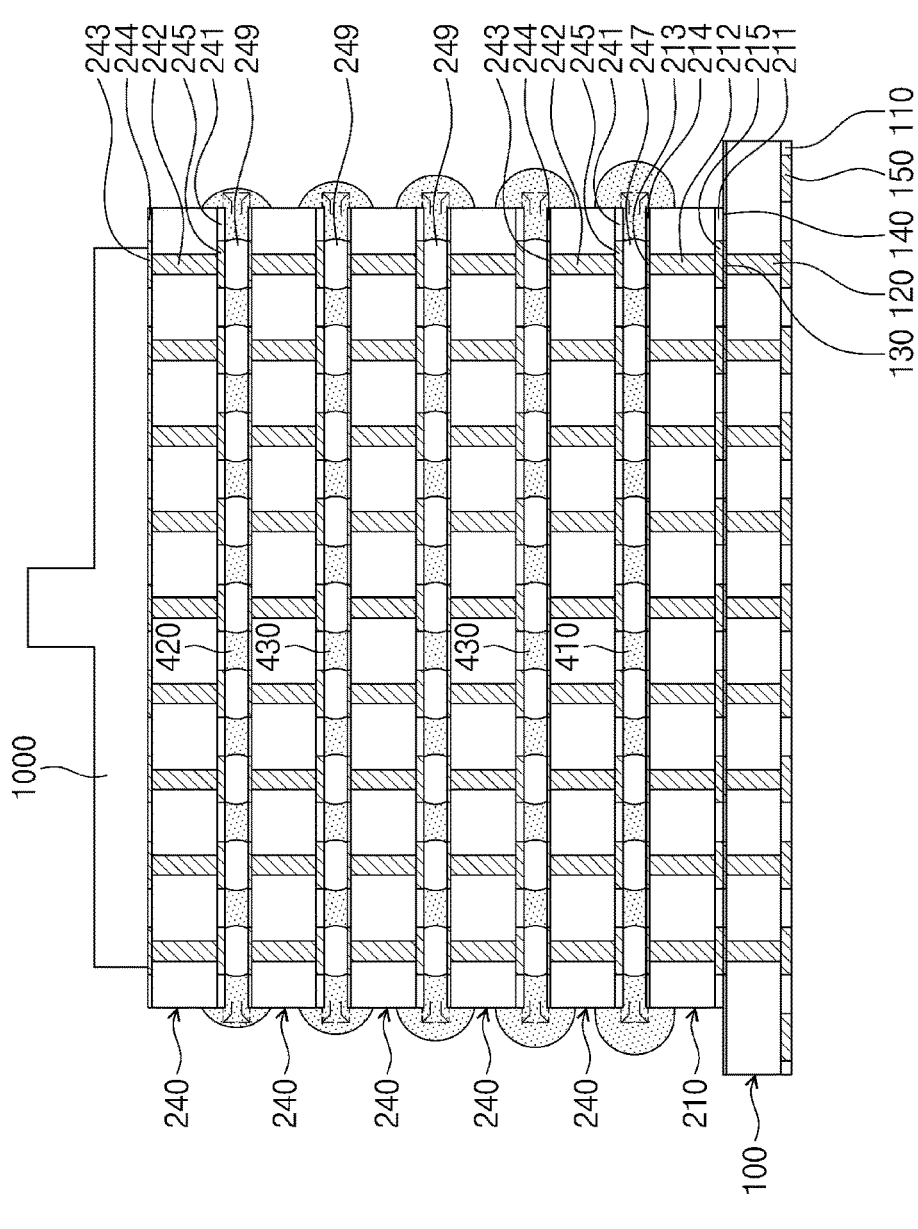

Referring to FIG. 14, the processes described with reference to FIGS. 11, 12, and 13 may be repeatedly performed to sequentially stack and mount the additional semiconductor chips 240 on the lower semiconductor chip 210. For example, the third chip connection terminal 249 and the third non-conductive layer 430 enclosing the same may be provided on the bottom surface (i.e., the active surface) of the additional semiconductor chip 240. The additional semiconductor chips 240 may be bonded to each other by a thermocompression bonding process. The third chip connection terminal 249 may be provided to electrically connect the additional semiconductor chips 240 to each other. In the case where the additional semiconductor chips 240 are compressed, the third non-conductive layer 430 may protrude from the side surfaces of the additional semiconductor chips 240 in an outward direction.

In an embodiment, a thermocompression bonding process may be performed on the additional semiconductor chips 240 at the same time. For example, the additional semiconductor chips 240 may be stacked on the lower semiconductor chip 210, and then, the thermocompression bonding process may be performed on the additional semiconductor chips 240 to reflow the first chip connection terminal 247 and the third chip connection terminals 249. In the thermocompression bonding process, the first non-conductive layer 410 and the third non-conductive layers 430 may be protruded to regions outside the side surfaces of the additional semiconductor chips 240. Here, the lower the height of each of the first and third non-conductive layers 410 and 430, the greater the pressure exerted by weights of the semiconductor chips 210 and 240 and the greater the distance protruding from the side surfaces of the additional semiconductor chips 240.

In the case where the lower semiconductor chip 210 is mounted on the base semiconductor chip 100 with a non-conductive layer interposed therebetween, the non-conductive layer may be excessively protruded in the thermocompression bonding process. For example, the non-conductive layer may be extended to a region outside the side surface of the base semiconductor chip 100. In an embodiment, the non-conductive layer may not be provided between the lower and base semiconductor chips 210 and 100. Thus, the non-conductive layers 410 and 430 may not be protruded excessively. This may make it possible to reduce a failure in a process of fabricating a semiconductor package.

Figure 15:
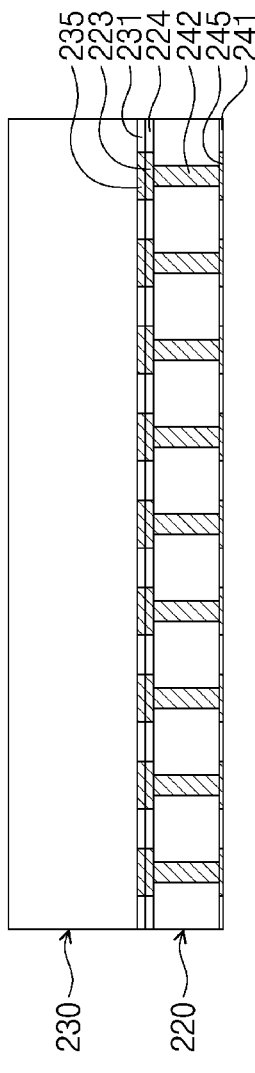

Referring to FIG. 15, the intermediate semiconductor chip 220 may be provided. The intermediate semiconductor chip 220 may be provided to have substantially the same or similar features as the intermediate semiconductor chip 220 described with reference to FIG. 1. For example, the intermediate semiconductor chip 220 may include the third circuit layer 221, which is provided on a surface of the intermediate semiconductor chip 220, the third protection layer 224, which is opposite to the third circuit layer 221, the third via 222, which is provided to penetrate the intermediate semiconductor chip 220 in a direction from the third protection layer 224 toward the third circuit layer 221, the third rear pad 223, which is provided in the third protection layer 224, and the third front pad 225, which is provided on the third circuit layer 221. The third circuit layer 221 may be provided on an active surface of the intermediate semiconductor chip 220, and hereinafter, a surface opposite to the active surface will be referred to as an inactive surface of the intermediate semiconductor chip 220.

The upper semiconductor chip 230 may be provided. The upper semiconductor chip 230 may be provided to have substantially the same or similar features as the upper semiconductor chip 230 described with reference to FIG. 1. For example, the upper semiconductor chip 230 may include the fourth circuit layer 231, which is provided on a surface of the upper semiconductor chip 230, and the fourth front pad 235, which is provided on the fourth circuit layer 231. The fourth circuit layer 231 may be provided on an active surface of the upper semiconductor chip 230, and hereinafter, a surface opposite to the active surface will be referred to as an inactive surface of the upper semiconductor chip 230.

The upper semiconductor chip 230 may be bonded to the intermediate semiconductor chip 220. The upper and intermediate semiconductor chips 230 and 220 may be bonded to each other in a chip-to-chip shape. The upper semiconductor chip 230 may be disposed on the intermediate semiconductor chip 220. For example, the active surface of the upper semiconductor chip 230 may face the inactive surface of the intermediate semiconductor chip 220. The upper semiconductor chip 230 may be disposed on the intermediate semiconductor chip 220 such that the third rear pad 223 of the intermediate semiconductor chip 220 is vertically aligned to the fourth front pad 235 of the upper semiconductor chip 230.

A thermal treatment process may be performed on the intermediate and upper semiconductor chips 220 and 230. As a result of the thermal treatment process, the third rear pad 223 and the fourth front pad 235 may be bonded to each other. For example, the third rear pad 223 and the fourth front pad 235 may be bonded or coupled to each other to form a single structure or layer. The bonding of the third rear pad 223 and the fourth front pad 235 may be achieved in a natural manner. In detail, the third rear pad 223 and the fourth front pad 235 may be formed of the same material (e.g., copper (Cu)), and in this case, the third rear pad 223 and the fourth front pad 235 may be bonded to each other by a surface activation phenomenon at an interface of the third rear pad 223 and the fourth front pad 235, which are in contact with each other, or and the consequent metal-to-metal hybrid bonding process. The third protection layer 224 and the insulating pattern of the fourth circuit layer 231 may be bonded to each other by the thermal treatment process.

Figure 16:
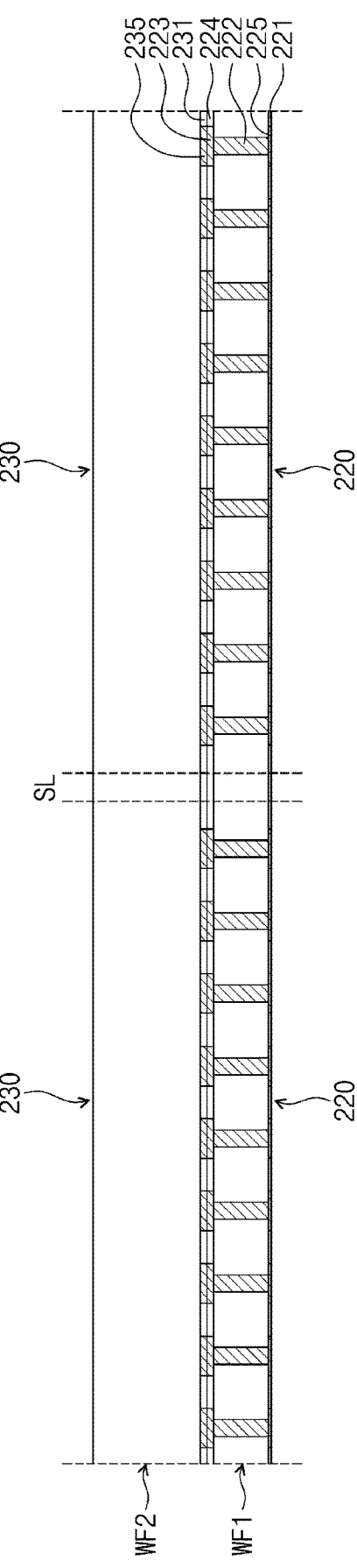

FIG. 15 illustrates an example, in which one upper semiconductor chip 230 is bonded to one intermediate semiconductor chip 220, or in which the intermediate and upper semiconductor chips 220 and 230 are bonded to each other in a chip-to-chip shape, but embodiments are not limited to this example. Referring to FIG. 16, a plurality of intermediate semiconductor chips 220 may be formed in a first semiconductor wafer WF1. In other words, the intermediate and upper semiconductor chips 220 and 230 may be bonded to each other in a wafer-to-wafer shape. For example, the intermediate semiconductor chips 220 may be formed on an active surface of the first semiconductor wafer WF1. In an embodiment, a plurality of upper semiconductor chips 230 may be formed on a second semiconductor wafer WF2. The upper semiconductor chips 230 may be formed on an active surface of the second semiconductor wafer WF2. The second semiconductor wafer WF2 may be disposed on the first semiconductor wafer WF1 such that each of the upper semiconductor chips 230 is aligned to a corresponding one of the intermediate semiconductor chips 220. The active surface of the first semiconductor wafer WF1 may be in contact with the active surface of the second semiconductor wafer WF2. A thermocompression bonding process may be performed on the first and second semiconductor wafers WF1 and WF2. As a result of the thermocompression bonding process, the intermediate semiconductor chips 220 and the upper semiconductor chips 230 may be bonded to each other. Thereafter, a singulation process may be performed on the first and second semiconductor wafers WF1 and WF2 along a sawing line SL. Accordingly, structures, each of which includes the intermediate and upper semiconductor chips 220 and 230, may be separated from each other.

Figure 17:
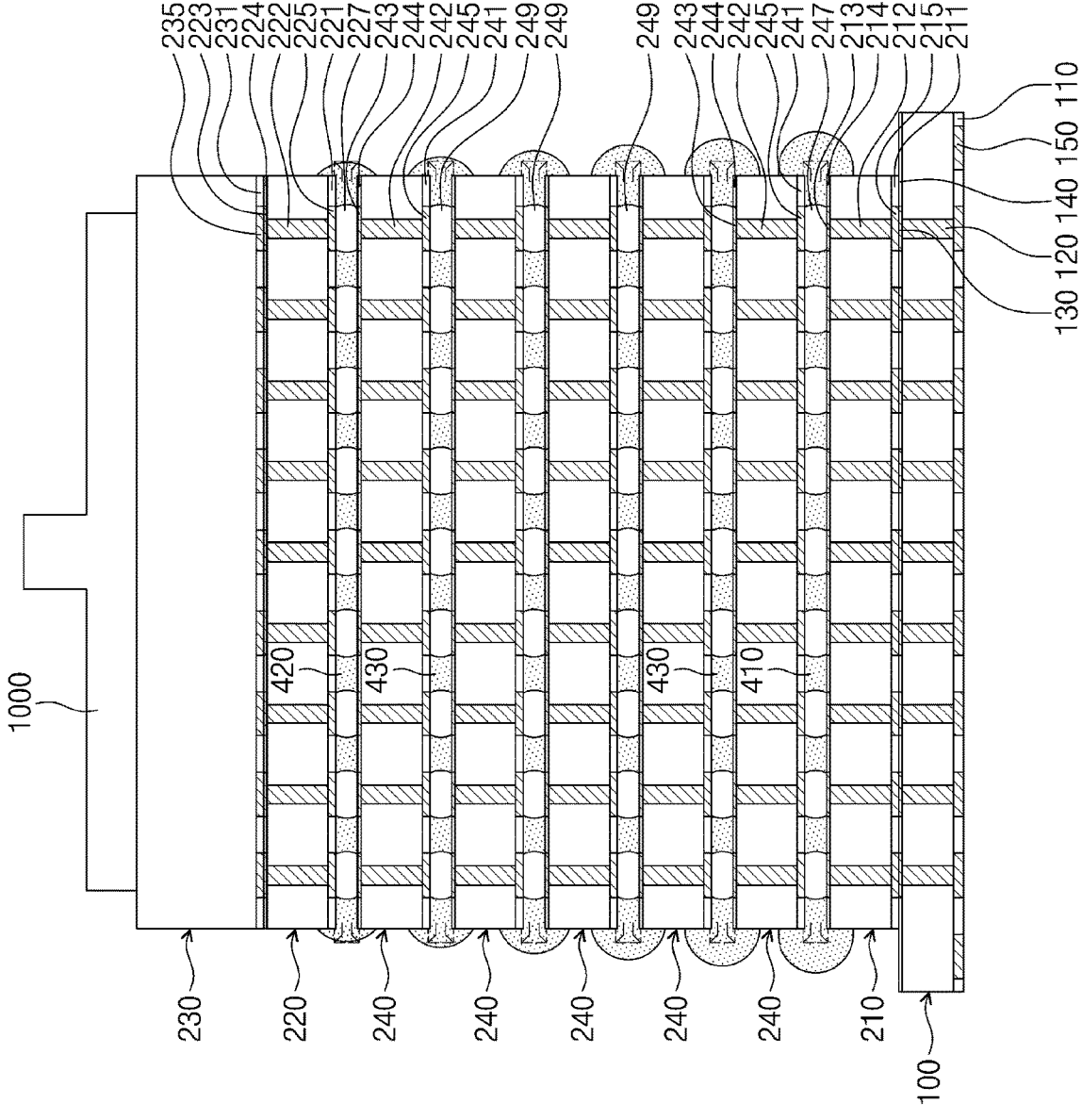

Referring to FIG. 17, the intermediate semiconductor chip 220 may be provided on the uppermost one of the additional semiconductor chips 240. In more detail, the second chip connection terminal 227 and the second non-conductive layer 420 enclosing the same may be provided on the bottom surface (i.e., the active surface) of the intermediate semiconductor chip 220. For example, the second chip connection terminal 227 may be provided on the third front pad 225 of the third circuit layer 221 of the intermediate semiconductor chip 220. The second non-conductive layer 420 may be a non-conductive film (NCF) or a non-conductive paste (NCP). The second non-conductive layer 420 may be provided on the inactive surface of the uppermost one of the additional semiconductor chips 240, and the intermediate semiconductor chip 220 may be provided on the second non-conductive layer 420.

A thermocompression bonding process may be performed to bond the intermediate semiconductor chip 220 to the uppermost one of the additional semiconductor chips 240. The second chip connection terminal 227 may be provided to electrically connect the intermediate semiconductor chip 220 to the uppermost one of the additional semiconductor chips 240. In the case where the intermediate semiconductor chip 220 is compressed toward the uppermost one of the additional semiconductor chips 240, the second non-conductive layer 420 may protrude from the side surface of the intermediate semiconductor chip 220 in an outward direction. The protruding portion of the second non-conductive layer 420 may form the second extended portion 425 (e.g., of FIG. 4). A portion of the second extended portion 425 may be extended to the side surface of the intermediate semiconductor chip 220 to and be disposed on a portion of the side surface of the intermediate semiconductor chip 220. In an embodiment, a portion of the second extended portion 425 covers a portion of the side surface of the intermediate semiconductor chip 220.

In the case where the upper semiconductor chip 230 is mounted on the intermediate semiconductor chip 220 with a non-conductive layer interposed therebetween, the non-conductive layer may be excessively protruded in the thermocompression bonding process. For example, the non-conductive layer may be extended along the side surface of the upper semiconductor chip 230 and be disposed on at least a portion of the upper semiconductor chip 230. In an embodiment, the non-conductive layer may cover at least a portion of the upper semiconductor chip 230. In an embodiment, the non-conductive layer may not be provided between the upper semiconductor chip 230, which is the uppermost one of the semiconductor chips 210, 220, 230, and 240, and the intermediate semiconductor chip 220. Thus, there may not be any non-conductive layer disposed on or covering the upper semiconductor chip 230. This may make it possible to reduce a failure in a process of fabricating a semiconductor package.

Referring back to FIG. 4, the mold layer 500 may be formed on the base semiconductor chip 100. The mold layer 500 may be disposed on the chip stack CS. In an embodiment, the mold layer 500 may cover the chip stack CS. The mold layer 500 on the base semiconductor chip 100 may be provided to encapsulate the lower semiconductor chip 210, the additional semiconductor chips 240, the intermediate semiconductor chip 220, the upper semiconductor chip 230, and the non-conductive layers 410, 420, and 440. In an embodiment, the mold layer 500 may be formed by forming an insulating member on the base semiconductor chip 100 and on the chip stack CS (for example, using a coating process) and curing the insulating member. In an embodiment, the mold layer may cover the chip stack CS. After the formation of the mold layer 500, a planarization process may be performed on the mold layer 500 to expose the top surface of the upper semiconductor chip 230, if necessary.

The outer terminals 160 may be provided on the bottom surface of the base semiconductor chip 100.

Figure 18:
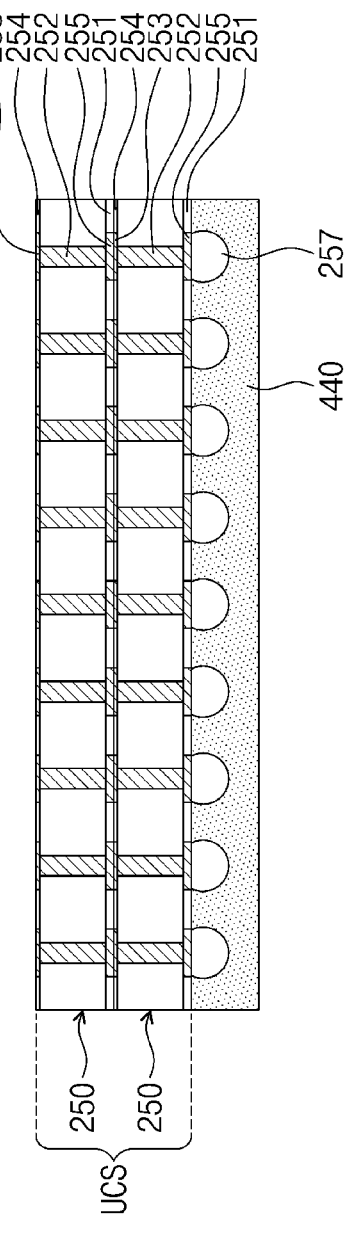
Figure 19:
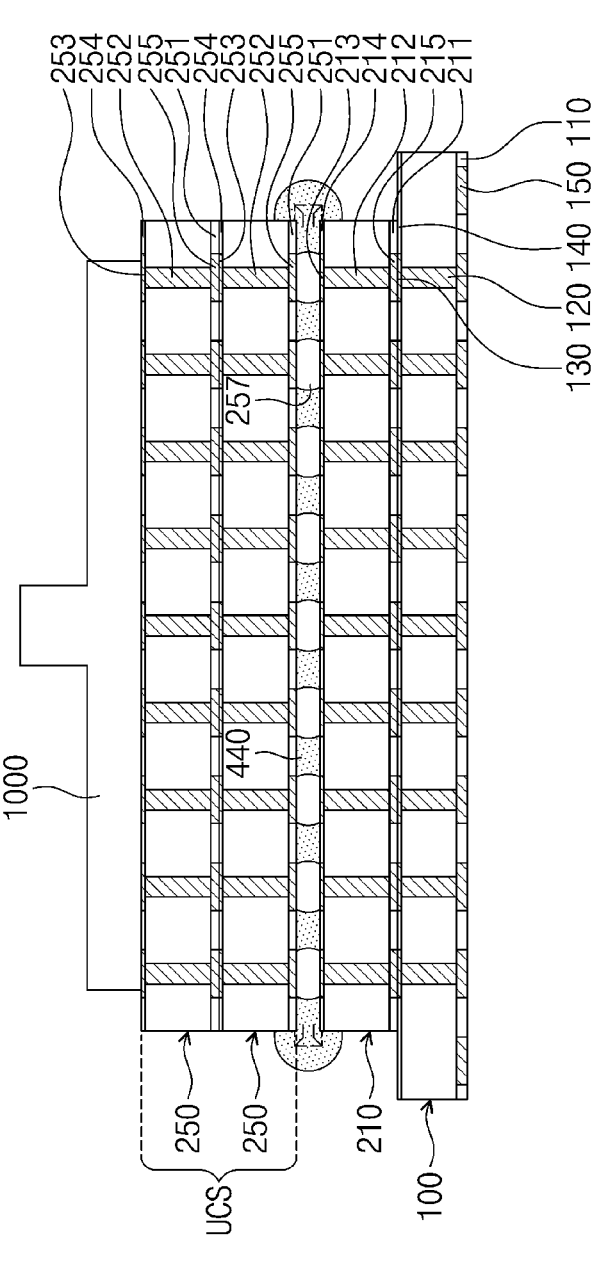
Figure 20:
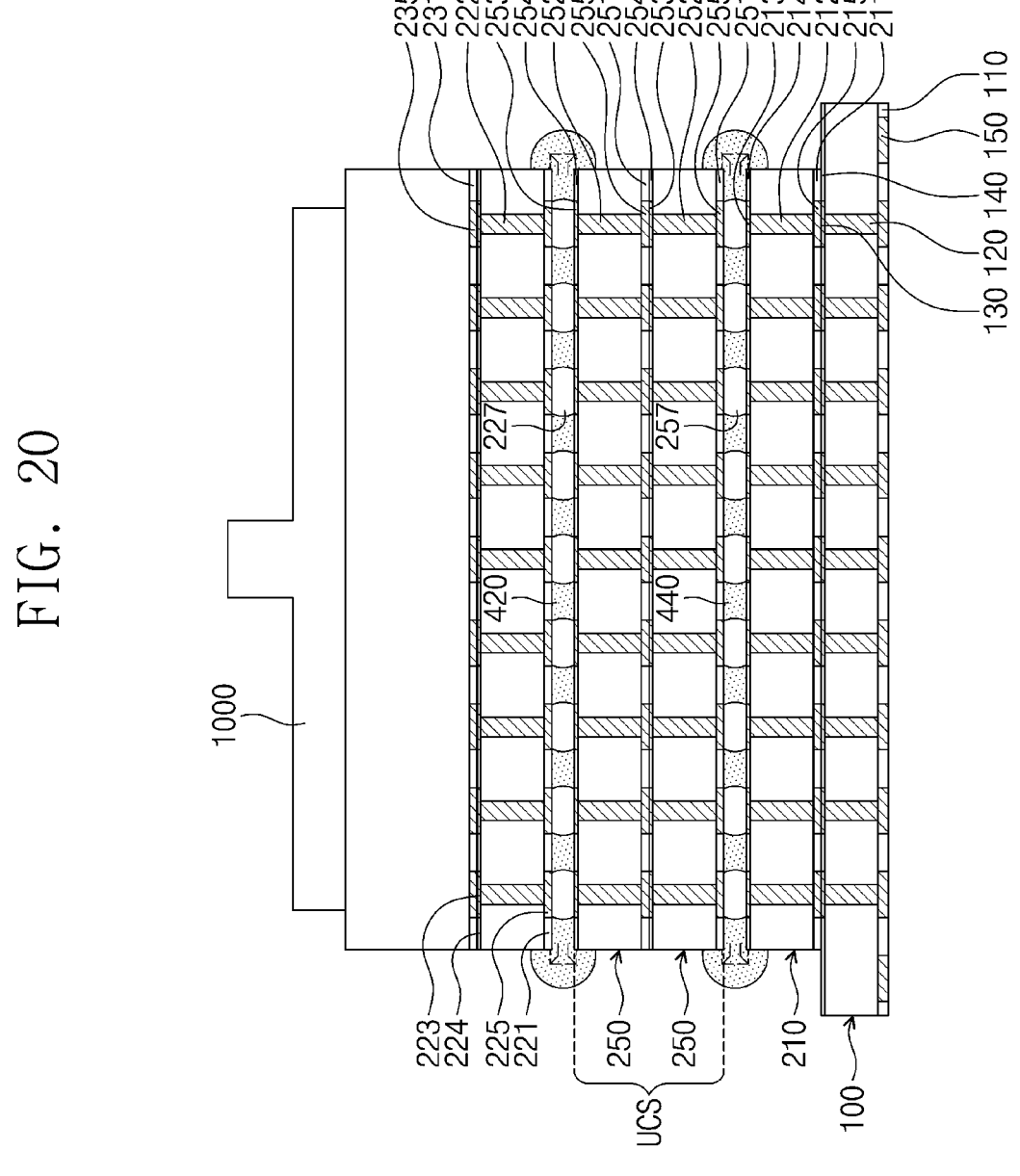

FIGS. 18, 19, and 20 are cross-sectional views illustrating a method of fabricating a semiconductor package, according to an embodiment.

Referring to FIG. 18, the sub-semiconductor chips 250 may be provided. The sub-semiconductor chips 250 may be provided to have substantially the same or similar features as the sub-semiconductor chips 250 described with reference to FIG. 5. For example, the sub-semiconductor chips 250 may include the sixth circuit layer 251, which is provided on a surface of the sub-semiconductor chips 250, the sixth protection layer 254, which is opposite to the sixth circuit layer 251, the sixth via 252, which is provided to penetrate the sub-semiconductor chips 250 in a direction from the sixth protection layer 254 toward the sixth circuit layer 251, the sixth rear pad 253, which is provided in the sixth protection layer 254, and the sixth front pad 255, which is provided on the sixth circuit layer 251. The sixth circuit layer 251 may be provided on an active surface of the sub-semiconductor chip 250, and hereinafter, a surface opposite to the active surface will be referred to as an inactive surface of the sub-semiconductor chip 250.

The sub-semiconductor chips 250 may be bonded to each other. The sub-semiconductor chips 250 may be bonded to each other in a chip-to-chip manner. Each of the sub-semiconductor chips 250 may be stacked on top of another. For example, one of the sub-semiconductor chips 250 may be provided such that an active surface thereof faces an inactive surface of another sub-semiconductor chip 250. The sub-semiconductor chips 250 may be stacked such that the sixth rear and front pads 253 and 255 thereof are vertically aligned to each other.

A thermal treatment process may be performed on the sub-semiconductor chips 250. The sixth rear pad 253 and the sixth front pad 255 may be bonded to each other by the thermal treatment process. For example, the sixth rear pad 253 and the sixth front pad 255 may be bonded or coupled to each other to form a single structure or layer. The bonding of the sixth rear pad 253 and the sixth front pad 255 may be achieved in a natural manner. In detail, the sixth rear pad 253 and the sixth front pad 255 may be formed of the same material (e.g., copper (Cu)), and in this case, the sixth rear pad 253 and the sixth front pad 255 may be bonded to each other by a surface activation phenomenon at an interface between the sixth rear pad 253 and the sixth front pad 255, which are in contact with each other, and the consequent metal-to-metal hybrid bonding process. In an embodiment, each chip structure UCS may be formed through the afore-described process.

The description above refers to an example, in which one sub-semiconductor chip 250 is bonded to another sub-semiconductor chip 250 or the sub-semiconductor chips 250 are bonded to each other in a chip-to-chip shape, but embodiments are not limited to this example. In an embodiment, the sub-semiconductor chips 250 may be bonded to each other in a wafer-to-wafer shape. For example, semiconductor wafers with the sub-semiconductor chips 250 may be bonded to each other, and then, a singulation process may be performed to separate the sub-semiconductor chips 250 from each other.

The fourth chip connection terminal 257 and the fourth non-conductive layer 440 enclosing the same may be provided on the bottom surface (i.e., the active surface) of the chip structure UCS. For example, the fourth chip connection terminal 257 may be provided on the sixth front pad 255 of the sixth circuit layer 251 of the sub-semiconductor chip 250 of the chip structure UCS. The fourth non-conductive layer 440 may be a non-conductive film (NCF) or a non-conductive paste (NCP).

Referring to FIG. 19, the chip structure UCS may be provided on the lower semiconductor chip 210 in the structure of FIG. 10. A thermocompression bonding process may be performed to bond the chip structure UCS to the lower semiconductor chip 210. The fourth chip connection terminal 257 may connect the lower semiconductor chip 210 electrically to the chip structure UCS. In the case where the chip structure UCS is compressed toward the lower semiconductor chip 210, the fourth non-conductive layer 440 may protrude from the side surface of the lower semiconductor chip 210 in an outward direction.

Referring to FIG. 20, the intermediate and upper semiconductor chips 220 and 230 may be provided, as described with reference to FIG. 15, and in this case, the upper semiconductor chip 230 may be bonded to the intermediate semiconductor chip 220.

The intermediate semiconductor chip 220 may be mounted on the chip structure UCS. The process of mounting the intermediate semiconductor chip 220 may be substantially the same or similar as the process of mounting the intermediate semiconductor chip 220 on the additional semiconductor chip 240, described with reference to FIG. 17.

Referring back to FIG. 5, the mold layer 500 may be formed on the base semiconductor chip 100. The mold layer 500 may be formed on the chip stack CS. In an embodiment, the mold layer 500 may cover the chip stack CS. The outer terminals 160 may be provided on the bottom surface of the base semiconductor chip 100.

In a semiconductor package according to an embodiment, it may be possible to prevent a failure, which may be caused by a non-conductive layer between a lower semiconductor chip and a base semiconductor chip and between an upper semiconductor chip and an intermediate semiconductor chip, and thereby to realize a semiconductor package with improved structural stability. Furthermore, it may be possible to reduce a warpage issue in a chip stack and thereby to prevent a detachment issue from occurring between semiconductor chips, which are bonded to each other in a hybrid bonding manner. In addition, it may be possible to reduce the number of the hybrid bonding structures, which are provided between the semiconductor chips in the chip stack, and thereby to easily perform a bonding process on the semiconductor chips in the chip stack.

While aspects of example embodiments have been particularly shown and described, it will be understood that varia in form and detail may be made therein without departing from the spirit and scope of the following claims.

What is claimed is:

1. A semiconductor package, comprising:
a substrate comprising a plurality of vias;
a chip stack on the substrate; and
a mold layer on the substrate and on at least a portion of the chip stack,
wherein the chip stack comprises:
a first semiconductor chip;
second semiconductor chips stacked on the first semiconductor chip;
a third semiconductor chip on an uppermost one of the second semiconductor chips; and

non-conductive layers, wherein one of the non-conductive layers is between the first semiconductor chip and a lowermost one of the second semiconductor chips, and at least one other of the non-conductive layers is between the second semiconductor chips, wherein a first chip pad of the first semiconductor chip is bonded to a substrate pad of the substrate, wherein the first chip pad and the substrate pad each comprise the same metallic material and form a first single structure or layer, wherein a second chip pad of the uppermost one of the second semiconductor chips is bonded to a third chip pad of the third semiconductor chip, wherein the second chip pad and the third chip pad each comprise the same metallic material and form a second single structure or layer, and wherein each of the second semiconductor chips is electrically connected to another of the second semiconductor chips or the first semiconductor chip using connection terminals on a bottom surface of each of the second semiconductor chips.

2. The semiconductor package of claim 1, wherein the non-conductive layers are disposed on the connection terminals, between the first semiconductor chip and the second semiconductor chips.

3. The semiconductor package of claim 1, wherein the non-conductive layers protrude to a region on a side surface of the chip stack, and the non-conductive layers are spaced apart from the substrate and the third semiconductor chip.

4. The semiconductor package of claim 1, wherein a bottom surface of the first semiconductor chip is in direct contact with a top surface of the substrate, and wherein a bottom surface of the third semiconductor chip is in direct contact with a top surface of the uppermost one of the second semiconductor chips.

5. The semiconductor package of claim 1, wherein the connection terminals comprise at least one of solder balls or solder bumps on the bottom surface of the second semiconductor chips.

6. The semiconductor package of claim 1, further comprising fourth semiconductor chips between the first semiconductor chip and the third semiconductor chip, wherein each of the fourth semiconductor chips is provided on a top surface of a corresponding one of the second semiconductor chips, wherein the semiconductor package further comprises chip structures that each comprise one of the second semiconductor chips and one of the fourth semiconductor chips, and wherein the second semiconductor chips and the fourth semiconductor chips constituting each of the chip structures are in contact with each other.

7. The semiconductor package of claim 6, wherein, in the chip structures, the second semiconductor chips have active surfaces facing the substrate, and the fourth semiconductor chips have active surfaces facing the substrate.

8. The semiconductor package of claim 6, wherein, in the chip structures, the second semiconductor chips have active surfaces facing the third semiconductor chip, and the fourth semiconductor chips have active surfaces facing the substrate.

9. The semiconductor package of claim 6, wherein each of the chip structures is electrically connected to another one of the chip structures using the connection terminals on the bottom surfaces of the second semiconductor chips.

10. The semiconductor package of claim 1, wherein widths of the non-conductive layers increase as a distance from the substrate decreases.

11. A semiconductor package, comprising:
a semiconductor substrate;
a chip stack on the semiconductor substrate; and
a mold layer on the semiconductor substrate and the chip stack,
wherein the chip stack comprises:
a first semiconductor chip on the semiconductor substrate;
chip structures stacked on the first semiconductor chip; and
non-conductive layers between the first semiconductor chip and the chip structures,
wherein each of the chip structures comprises:
a second semiconductor chip;
a third semiconductor chip on the second semiconductor chip; and
first connection terminals on a bottom surface of the second semiconductor chip,
wherein a bottom surface of the first semiconductor chip is in direct contact with a top surface of the semiconductor substrate,
wherein, in the chip structures, a bottom surface of the third semiconductor chip is in direct contact with a top surface of the second semiconductor chip,
wherein the non-conductive layers are provided on the first connection terminals,
wherein one of the non-conductive layers is between the first semiconductor chip and a lowermost one of the chip structures, and at least one other of the non-conductive layers is between the chip structures, and
wherein the non-conductive layers are spaced apart from the semiconductor substrate.

12. The semiconductor package of claim 11, wherein the non-conductive layers are spaced apart from the third semiconductor chip in an uppermost one of the chip structures.

13. The semiconductor package of claim 11, wherein a first chip pad of the first semiconductor chip is bonded to a substrate pad of the semiconductor substrate, and the first chip pad and the substrate pad each comprise the same metallic material and form a single structure or layer.

14. The semiconductor package of claim 11, wherein, in the chip structures, a second chip pad of the second semiconductor chip is bonded to a third chip pad of the third semiconductor chip, and the second chip pad and the third chip pad each comprise the same metallic material and form a single structure or layer.

15. The semiconductor package of claim 11, wherein the non-conductive layers protrude to a region on a side surface of the chip stack, and widths of the non-conductive layers increase as a distance from the semiconductor substrate decreases.

16. The semiconductor package of claim 11, wherein the first connection terminals comprise at least one of solder balls or solder bumps on the bottom surface of the second semiconductor chip.

17. The semiconductor package of claim 11, wherein, in each of the chip structures, an active surface of the second semiconductor chip and an active surface of the third semiconductor chip face the semiconductor substrate, and the active surface of the third semiconductor chip contacts an inactive surface of the second semiconductor chip.

18. The semiconductor package of claim 11, wherein, in each of the chip structures, an active surface of the second semiconductor chip and an active surface of the third semiconductor chip face each other, and the active surface of the third semiconductor chip and the active surface of the second semiconductor chip contact each other.

19. The semiconductor package of claim 11, wherein each of the chip structures further comprises a fourth semiconductor chip on the third semiconductor chip, and wherein, in the chip structures, a bottom surface of the fourth semiconductor chip is in direct contact with a top surface of the third semiconductor chip.

20. A semiconductor package, comprising:

a semiconductor substrate comprising a substrate pad;

a first semiconductor chip on the semiconductor substrate, the first semiconductor chip comprising a first chip pad bonded to the substrate pad of the semiconductor substrate, the first chip pad and the substrate pad each comprising the same metallic material and forming a single structure or layer;

second semiconductor chips stacked on the first semiconductor chip, wherein a lowermost one of the second semiconductor chips is electrically connected to the first semiconductor chip using connection terminals provided on a bottom surface of the lowermost one of the second semiconductor chips;

non-conductive layers on bottom surfaces of the second semiconductor chips, wherein a first one of the non-conductive layers is between the lowermost one of the second semiconductor chips and the first semiconductor chip, and a second one of the non-conductive layers is between two of the second semiconductor chips;

a third semiconductor chip on an uppermost one of the second semiconductor chips, the uppermost one of the second semiconductor chips and the third semiconductor chip comprising a second chip pad and a third chip pad, respectively, wherein the second chip pad and the third chip pad each comprise the same metallic material and are bonded to each other and form a single structure or layer; and a mold layer on the semiconductor substrate and the first semiconductor chip, the second semiconductor chips, and the third semiconductor chip, wherein the non-conductive layers are spaced apart from the semiconductor substrate and the third semiconductor chip, wherein the first one of the non-conductive layers protrudes a first distance beyond a side surface of the lowermost one of the second semiconductor chips, and wherein the second one of the non-conductive layers protrudes a second distance beyond side surfaces of the two of the second semiconductor chips, the second distance being less than the first distance.

* * * * *